United States Patent
Kobayashi et al.

(10) Patent No.: US 7,147,484 B1
(45) Date of Patent: Dec. 12, 2006

(54) ELECTRONIC APPARATUS AND BOARD ASSEMBLY

(75) Inventors: Sonomasa Kobayashi, Kawasaki (JP); Katsuichi Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/274,235

(22) Filed: Nov. 16, 2005

(30) Foreign Application Priority Data

Aug. 24, 2005 (JP) ............... 2005-243193

(51) Int. Cl.
*H01R 12/00* (2006.01)
(52) U.S. Cl. .................. 439/74; 361/790; 361/683
(58) Field of Classification Search ............. 439/74; 361/790, 791, 683, 686, 685
See application file for complete search history.

(56) References Cited

U.S. PATENT DOCUMENTS

| | | | |
|---|---|---|---|
| 5,091,826 A * | 2/1992 | Arnett et al. | 361/776 |
| 5,114,353 A * | 5/1992 | Sample | 439/65 |
| 5,570,269 A * | 10/1996 | Korikawa et al. | 361/685 |
| 6,376,778 B1 * | 4/2002 | Huang | 174/254 |
| 6,595,786 B1 * | 7/2003 | Horiuchi et al. | 439/74 |
| 6,898,086 B1 * | 5/2005 | Takami et al. | 361/792 |
| 6,947,281 B1 * | 9/2005 | Wrycraft et al. | 361/695 |
| 6,976,854 B1 * | 12/2005 | Stockhaus et al. | 439/79 |
| 6,979,774 B1 * | 12/2005 | Abe et al. | 174/377 |
| 7,043,958 B1 * | 5/2006 | McGee et al. | 73/1.07 |
| 2002/0009910 A1 * | 1/2002 | Posey et al. | 439/131 |
| 2003/0220009 A1 | 11/2003 | Takeguchi et al. | |

FOREIGN PATENT DOCUMENTS

JP     2003-345464     12/2003

* cited by examiner

*Primary Examiner*—Tulsidas C. Patel
*Assistant Examiner*—Harshad C Patel
(74) *Attorney, Agent, or Firm*—Staas & Halsey LLP

(57) ABSTRACT

The present invention provides an electronic apparatus and a board assembly which are easy to assemble by increasing their visibility even when a connector is disposed in a position where it is originally difficult to see. The apparatus includes: a board assembly including two circuit boards fixed to each other with predetermined space formed between the circuit boards; a first connector disposed on a surface of one of the circuit boards facing the other one of the circuit boards, the first connector being disposed at one end of the surface; and a second connector connected to an end of a cable and capable of mating with the first connector. The other one of the circuit boards has an indentation for visually observing the first connector at a portion facing the first connector.

14 Claims, 32 Drawing Sheets

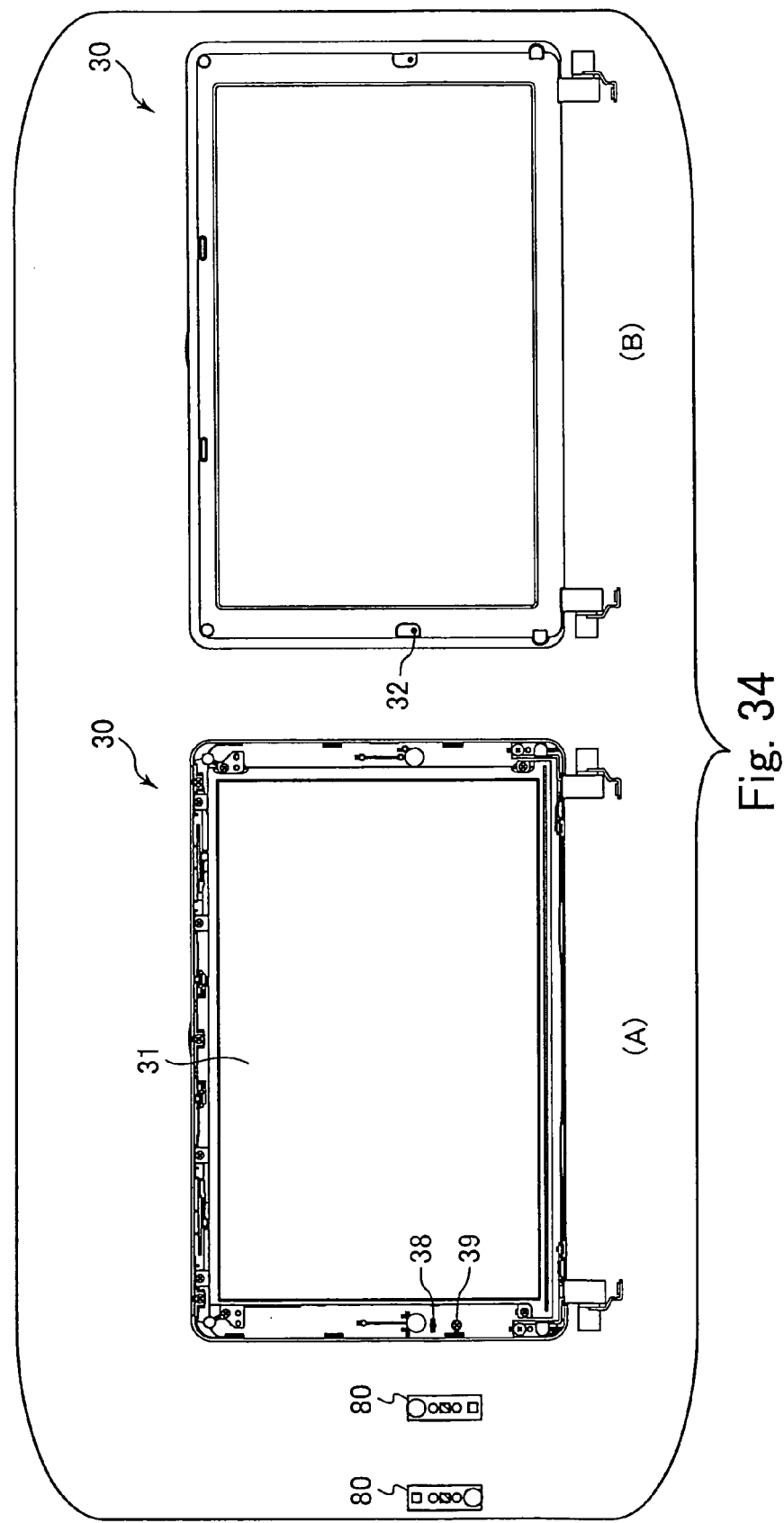

ELECTRONIC APPARATUS AND BOARD ASSEMBLY

BACKGROUND OF THE INVENTION

1. Field of the Invention

The present invention relates to an electronic apparatus represented by a personal computer for example and to a board assembly used in the electronic apparatus.

2. Description of the Related Art

In recent years, personal computers (hereinafter sometimes referred to as "PC") have been in widespread use not only in offices but also at homes. As one type of personal computers, there have been widely known notebook personal computers (hereinafter referred to as "notebook PC") each composed of: a main unit having a keyboard on the top surface; and a display unit openable and closable with respect to the main unit and having a display screen. The display unit is opened to stand relative to the main unit when in use and is folded to lie on the keyboard when not in use.

Also, plate-like tablet personal computers (hereinafter referred to as "tablet PC") having a display screen on the top surface have emerged in recent years. A user enters an instruction into this type of PC by bringing a stylus closer to a position on the display screen or touching the position with the stylus so as to make the tablet PC recognize the position.

Also, another type of electronic apparatus capable of operating both as a notebook PC and a tablet PC have come along recently. This type of apparatus has a main unit and a display unit which are connected via a two-axis connection section that supports the main unit and the display unit in such a manner that they can be opened/closed and rotated.

General electronic apparatus such as personal computers are desired to be smaller in size. Particularly, the above-mentioned notebook PCs, tablet PCs and the like are desired to be smaller and thinner because they need to be portable. Lately, as the notebook PCs have become more and more multifunctional, performance of notebook PCs has almost reached the high level comparable to that of desktop PCs. Therefore, it is desired to realize a smaller and thinner apparatus that also maintains high operability while keeping with the trend toward multifunction. Not only notebook PCs but also various types of devices, such as game machines, DVD recorders and players, hard-disk recorders are desired to be smaller and thinner for the purpose of saving space of an installation site.

When an apparatus is made smaller in size, a number of components and units need to be packed in tight space in a cabinet, which may cause problems related to assembly during manufacturing. One of such problems relates to engagement of connectors inside the apparatus. Inside the apparatus, various types of components and the like are arranged. In order to exchange signals between one circuit board and another circuit board disposed inside the apparatus, the apparatus adopts such a structure that the one circuit board and the another circuit board are connected with a cable and that the one circuit board is equipped with one connector that is mated with the other connector provided at the tip of the cable connected to the another circuit board. In this structure, assembly is easy if the connector can be arranged at a position on the circuit board where it can be readily and visually observed. However, when the connector is arranged at a position hidden by the circuit board, the connector is difficult to see, which extremely reduces working efficiency when mating the connectors with each other during assembly process.

Japanese Patent Application Publication NO. 2003-345464 discloses a connector disposed on a sidewall of a cabinet. However, a user needs to insert the connector while watching it from the side, which extremely reduces working efficiency because the user cannot see the position of the connector when looking at the cabinet from above. Under the condition where various components are packed in tight space inside the cabinet, the working efficiency becomes worse.

In view of the foregoing, the present invention provides an electronic apparatus and a board assembly which are easy to assemble by increasing visibility of a connector disposed in a position where it would be otherwise difficult to be visually observed.

SUMMARY OF THE INVENTION

The present invention provides an electronic apparatus including:

a board assembly including two circuit boards fixed to each other with predetermined space formed between the circuit boards;

a first connector disposed on a surface of one of the circuit boards facing the other one of the circuit boards, the first connector being disposed at one end of the surface; and a second connector connected to an end of a cable and capable of mating with the first connector, wherein the other one of the circuit boards has an indentation for visually observing the first connector at a portion facing the first connector.

The electronic apparatus may further include a main circuit board on which an electronic component is mounted, wherein the board assembly is fixed on the main board such that predetermined space is formed between the board assembly and the main board and the one of the circuit boards is disposed in the main circuit board side.

The present invention also provides a board assembly including:

a first circuit board;

a second circuit board fixed to the first circuit board with predetermined space formed between the first and second circuit boards; and a connector disposed on a surface of the first circuit board facing the second circuit board, the connector being disposed at one end of the surface, wherein the second circuit board has an indentation for visually observing the connector at a portion facing the connector.

The board assembly may be fixed on a main board having mounted thereon an electronic component to be installed in an electronic apparatus, the board assembly being fixed on the main board such that predetermined space is formed between the main assembly and the main board and the first circuit board is disposed in the main circuit board side.

As described above, according to the invention, visibility of a connector on a circuit board and working efficiency can be greatly enhanced.

BRIEF DESCRIPTION OF THE DRAWINGS

FIG. 34 is a plan view of the display unit of the notebook PC.

DETAILED DESCRIPTION OF PREFERRED EMBODIMENTS

An embodiment of the present invention will be described.

1. Appearance

Figure 1:
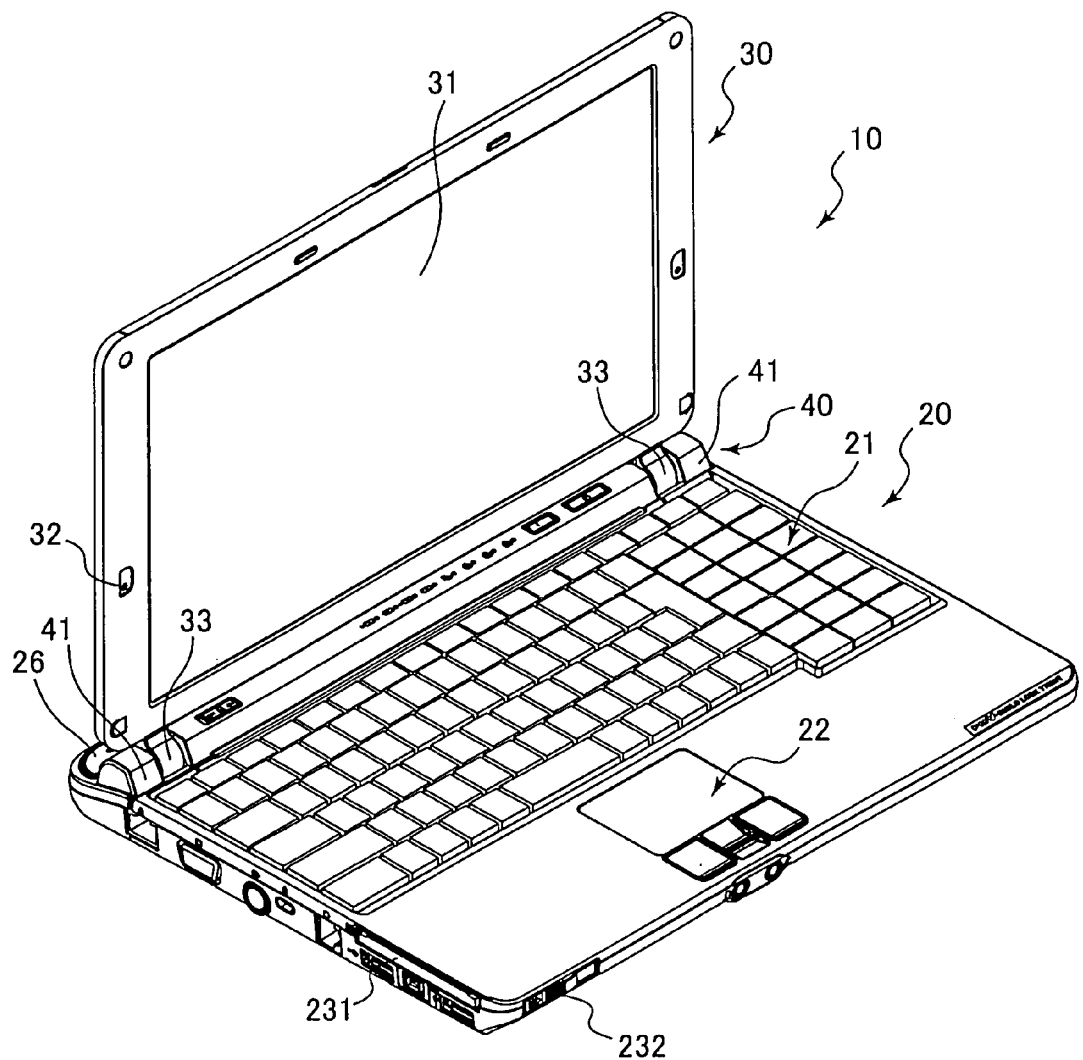
FIG. 1 is a perspective view of a notebook PC according to an embodiment of the present invention, showing the front thereof as viewed obliquely.
Figure 2:
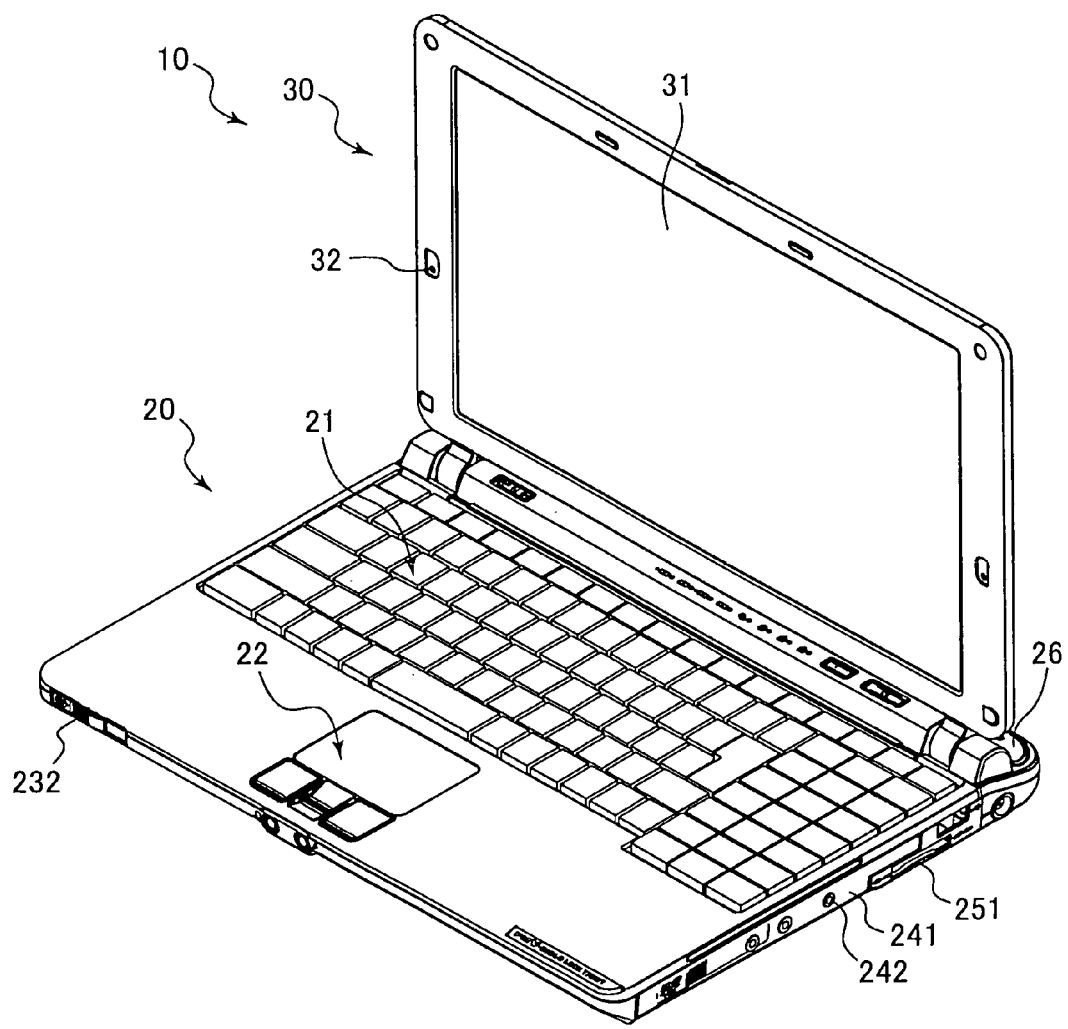
FIG. 2 is a perspective view of the notebook PC in FIG. 1, showing the front thereof as viewed obliquely from an angle different from FIG. 1.
Figure 3:
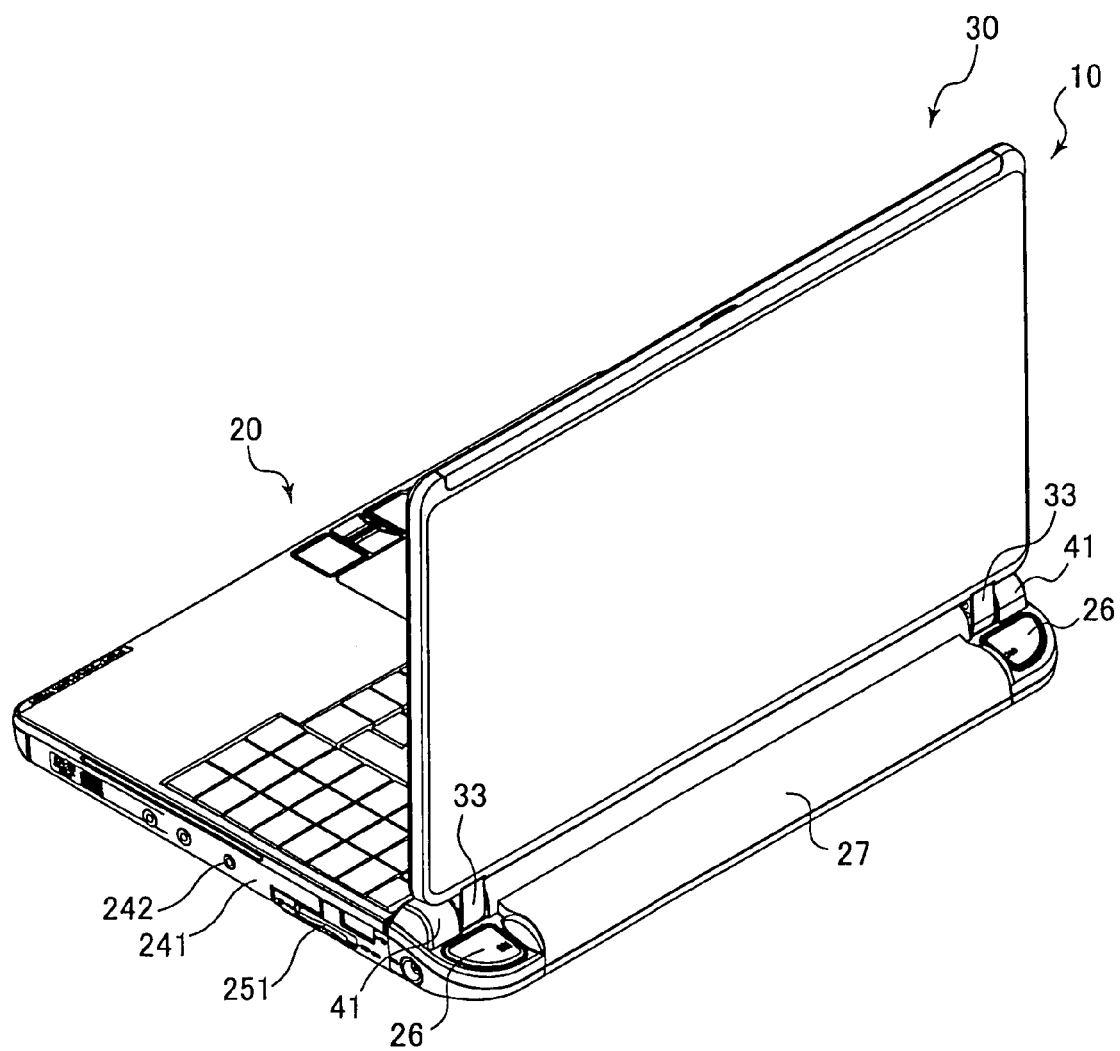
FIG. 3 a perspective view of the notebook PC in FIG. 1, showing the back thereof as viewed obliquely.
Figure 4:
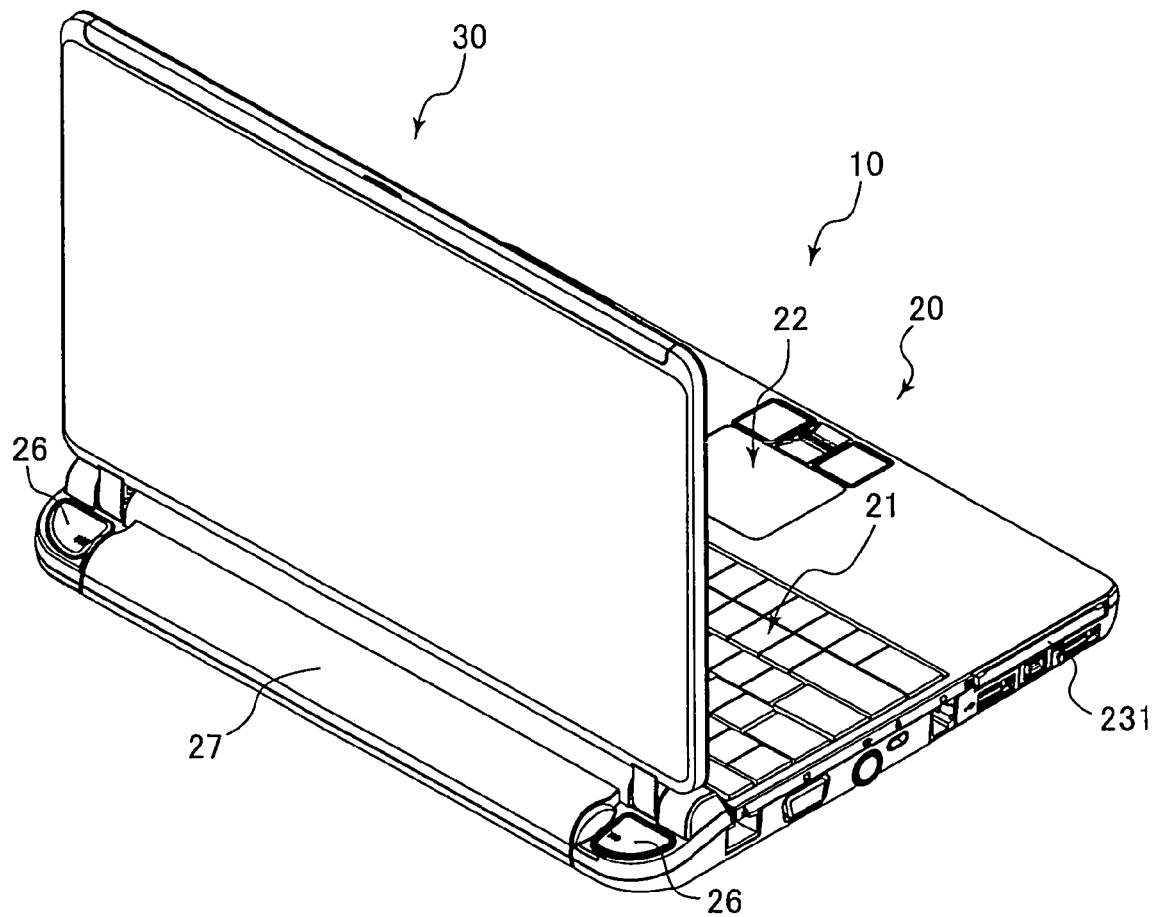
FIG. 4 is a perspective view of the notebook PC in FIG. 1, showing the back thereof as obliquely viewed from an angle different from FIG. 3.

FIGS. 1 through 4 are perspective views of a notebook PC 10 according to an embodiment of the present invention. FIGS. 1 and 2 illustrate the front of the notebook PC 10 as obliquely viewed from different angles, and FIGS. 3 and 4 illustrate the back of the notebook PC 10 as obliquely viewed from different angles.

The notebook PC 10 is composed of two cabinets: a main unit 20 and a display unit 30. The display unit 30 is supported by a hinge section 40 so that it can be opened and closed with respect to the main unit 20.

The main unit 20 has a keyboard 21, a trackpad 22, etc. on its top surface and also has an insertion opening 231 of a PC card slot, which accesses a PC card removably inserted thereinto as will be described later, on the left flank. On the front surface of the main unit 20, there is disposed an operation member 232 to be slidably operated for removing a PC card inserted into the PC card slot. Inside the cabinet of the main unit 20, there is a main circuit board on which circuits such as a CPU for performing various processing and other components are mounted. Also, part of the right flank of the main unit 20 is formed by an end surface 241 of a CD/DVD drive for accessing a removable CD or DVD inserted and rotated therein, which will also be described later. The end surface 241 has an eject button 242 that causes a tray of the CD/DVD drive to slide out from the main unit 20 when pressed.

The right flank of the main unit 20 has an insertion opening 251 of a media slot for accessing various types of removable recording media (SmartMedia™, xD-card™, etc.) inserted therein. The insertion opening 251 is so formed as to vertically overlap the CD/DVD drive.

When the display unit 30 is closed with respect to the main unit 20, the external form of the main unit 20 covered by the display unit 30 is nearly a rectangular solid.

The display unit 30 has a large-sized display screen 31 and a front cover surrounding the display screen 31 on its front. On the front cover, there is formed a hole 32 for leading sound to a microphone (not shown) disposed inside the display unit 30.

The hinge section 40 is so configured as to support the display unit 30 in such a manner that the display unit 30 is openable and closable with respect to the main unit 20.

The display unit 30 needs to be rotatable with respect to the main unit 20 and at the same time, it must be capable of remaining in any position when the display unit 30 is open with respect to the main unit 20. For this purpose, the display unit 30 has friction members 41. The friction members 41 serve to apply friction to rotation shafts 33 of the display unit 30 so that the display unit 30 can remain in any position when the display unit 30 is open with respect to the main unit 20.

Behind the hinge section 40, there are disposed speakers 26 in the right and left of the rear part of the main unit 20. To an area between these two speakers 26, a battery unit 27 containing a battery for supplying power to components of the notebook PC 10 is removably attached. The rear-end surface of the battery unit 27 is nearly flush with portions of the cabinet of the main unit 20 that support the speakers 26.

2. CD/DVD Drive and Media Slot

Figure 5:
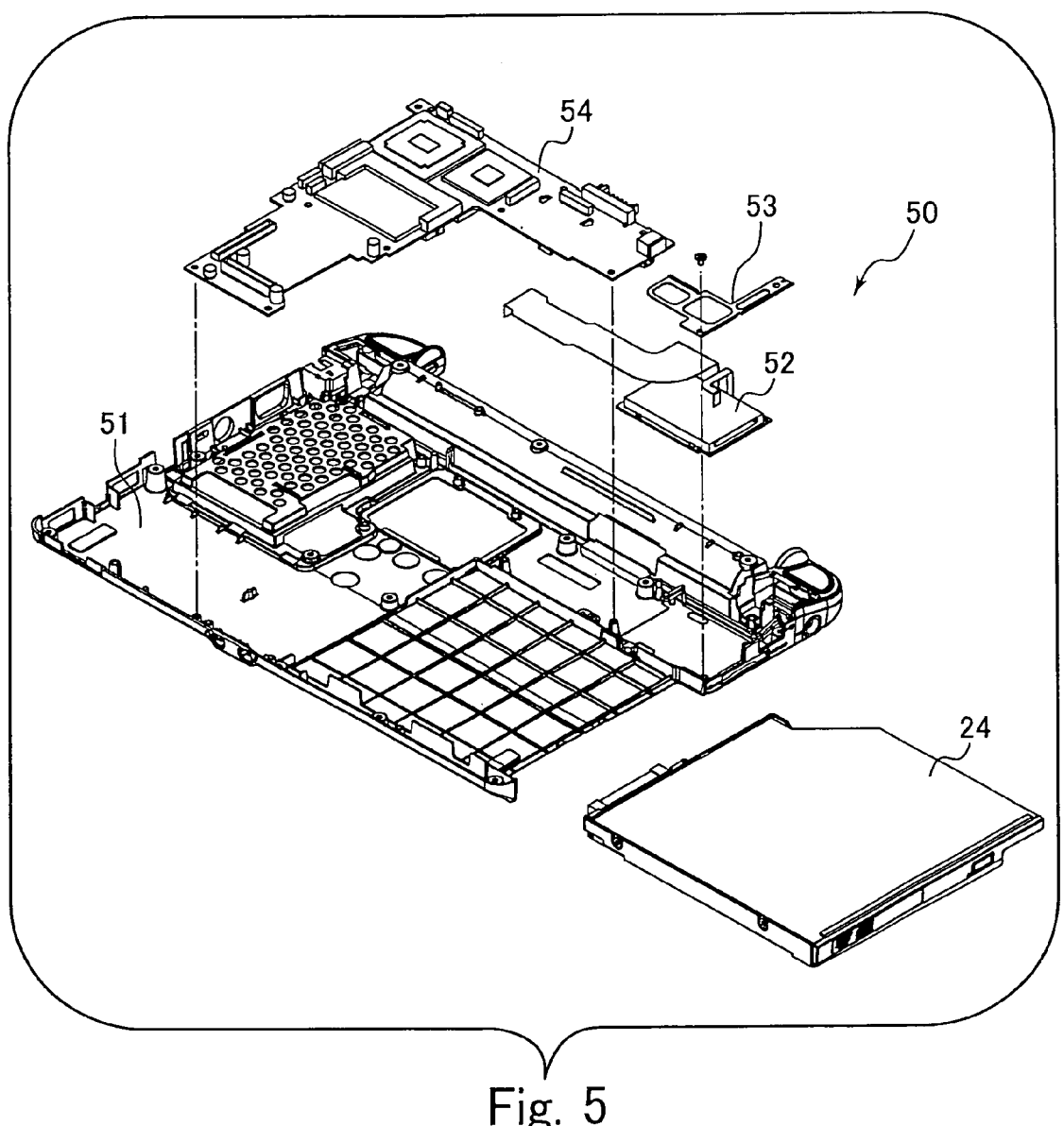
FIG. 5 is an exploded perspective view of a unit including a CD/DVD drive and a media slot.
Figure 6:
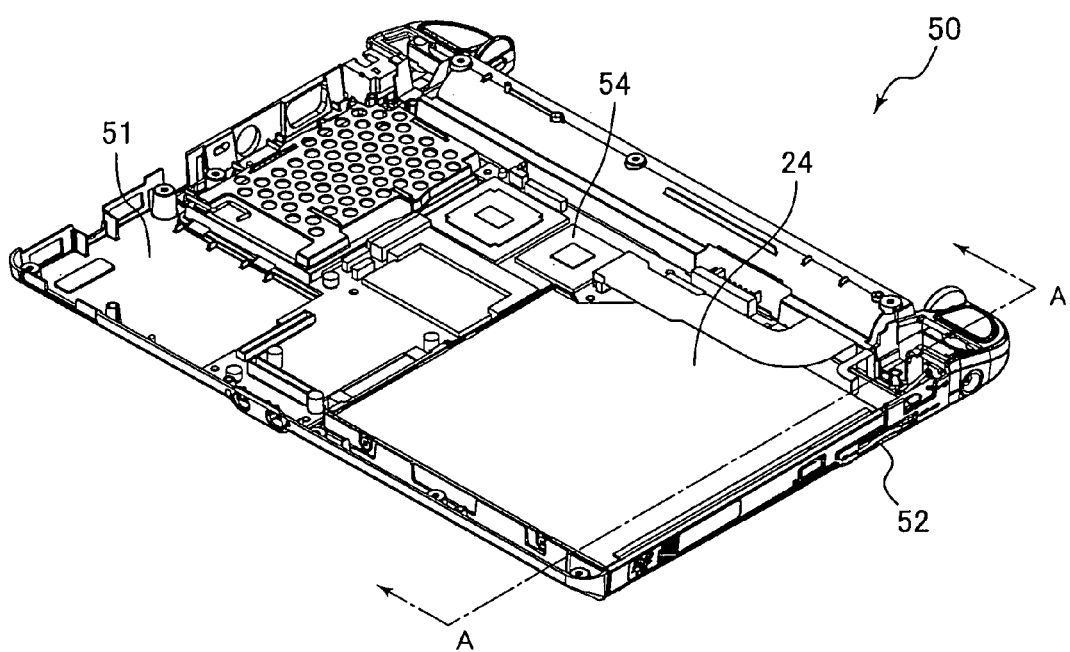
FIG. 6 is a perspective view of the unit shown in FIG. 5 when it is assembled.
Figure 7:
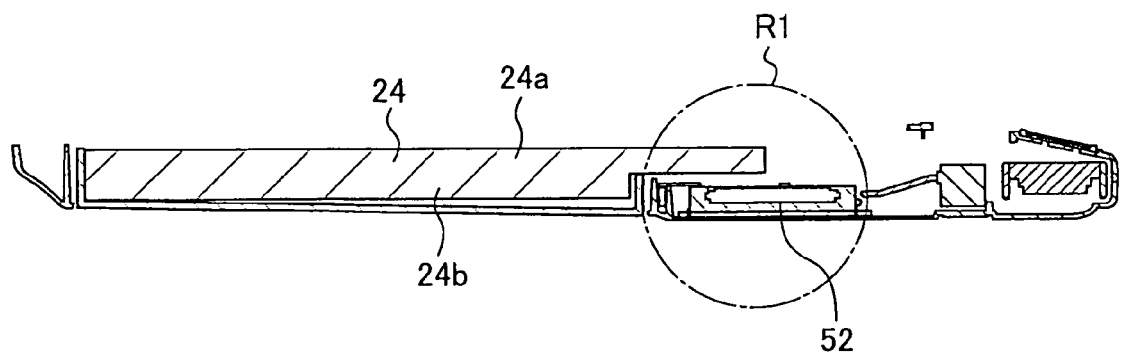
FIG. 7 is a cross-sectional view taken along an arrow A—A shown in FIG. 6.
Figure 8:
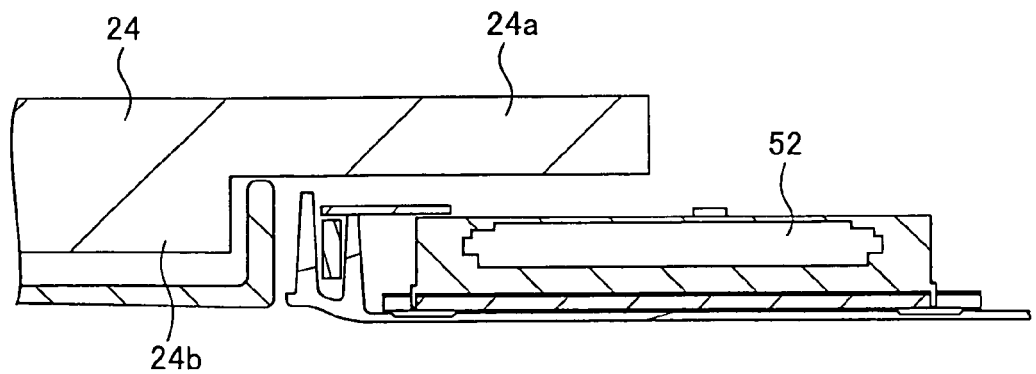
FIG. 8 is an enlarged view of the portion in a circle R1 indicated with a chain line shown in FIG. 7.

FIG. 5 is an exploded perspective view of a unit 50 including the CD/DVD drive and the media slot according to the embodiment. FIG. 6 is a perspective view of the unit 50 shown in FIG. 5 when it is assembled. FIG. 7 is a cross-sectional view taken along an arrow A—A shown in FIG. 6. FIG. 8 is an enlarged view of the portion in a circle R1 indicated with a chain line shown in FIG. 7.

Figure 9:
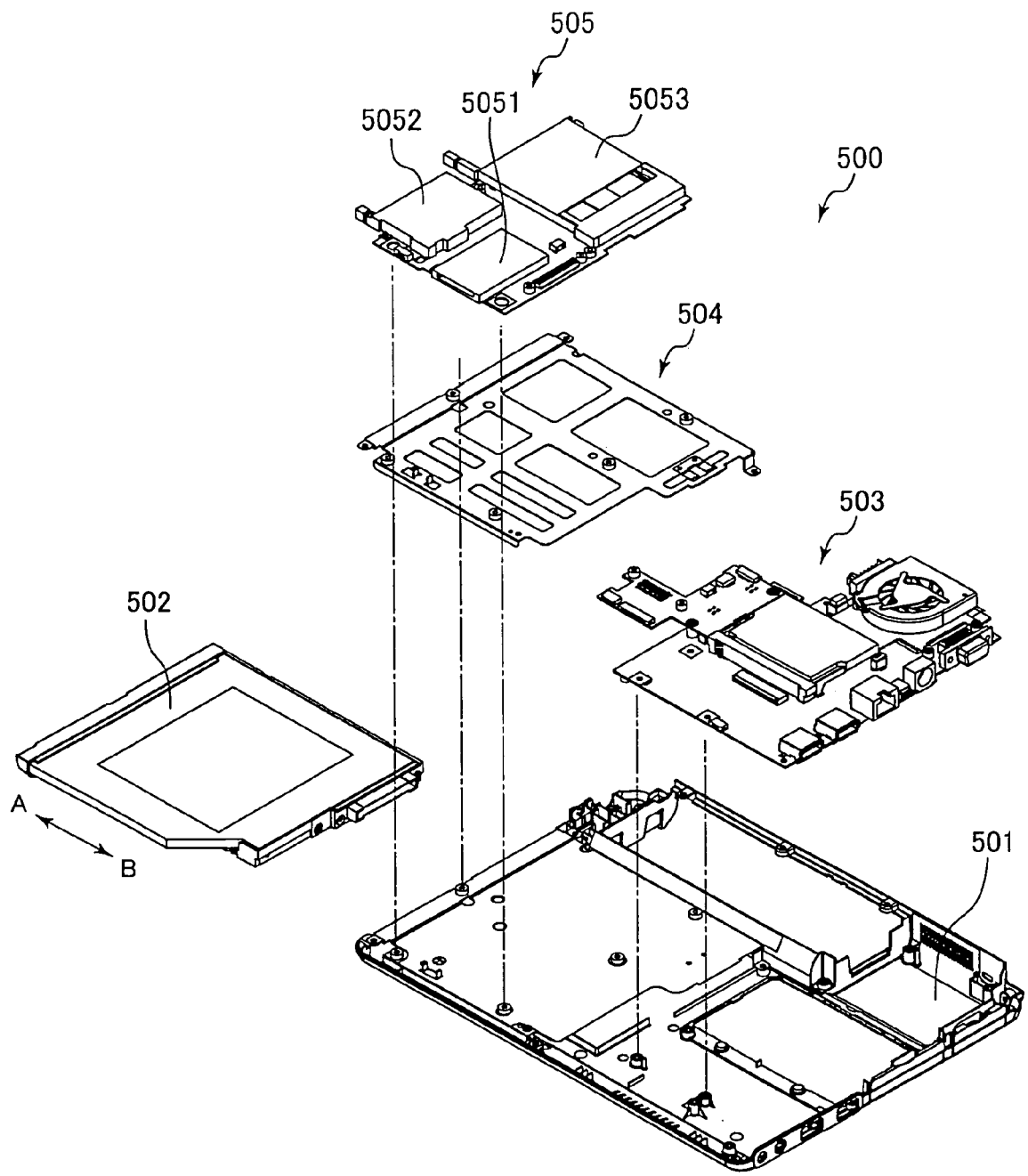
FIG. 9 is an exploded perspective view of a conventional unit including a CD/DVD drive and a media slot, shown as an example to be compared with the present invention.

Also, FIG. 9 is an exploded perspective view of a conventional unit 500 including a CD/DVD drive and a media slot, which is shown as an example to be compared with the present embodiment.

The example shown in FIG. 9 will be described first.

The unit 500 is composed of a base plate 501, a CD/DVD drive 502, a motherboard 503, a chassis 504, and a media unit 505. The media unit 505 has a media slot 5051, a CF card slot 5052, and a PC card slot 5053 are mounted thereon.

The unit 500 is assembled in such a manner that the CD/DVD drive 502 and the motherboard 503 are mounted on the base plate 501, the chassis 504 is mounted on the CD/DVD drive 502, and then the media unit 505 is mounted on the chassis 504. In this case, the thickness of a portion, which includes the mounted CD/DVD drive 502, of the unit 500 is equal to the sum of the thicknesses of the base plate 501, CD/DVD drive 502, chassis 504, and media unit 505. Here, attention is focused on the media slot 5051 mounted on the media unit 505, and the total thickness of the portion including the mounted media slot 5051 is determined with consideration given to the thickness of the media slot 5051 instead of the thickness of the media unit 505.

Now, the present embodiment will be described with reference to FIGS. 5 through 8.

The unit 50 shown in FIG. 5 is composed of a base plate 51, a CD/DVD drive 24, a media slot 52, a mounting fitting 53, and a circuit board 54.

As shown in FIG. 7, the CD/DVD drive 24 has a double-layer cabinet composed of a first rectangular portion 24a and a second rectangular portion 24b formed thereon, which both extend laterally. The second rectangular portion 24b is shorter than the first rectangular portion 24a in the lateral direction, and the one end (the left side in FIG. 7) of the second rectangular portion 24b in the lateral direction is aligned with that of the first rectangular portion 24a. Disposed inside the first rectangular portion 24a is a medium loading section into which a CD or DVD is loaded. In contrast, disposed inside the second rectangular portion 24b is a medium driving section for driving a CD or DVD loaded into the medium loading section. The medium loading section has a tray for holding a CD or DVD and ejects the tray upon depression of the eject button 242. When the tray retracts, the medium driving section accesses a CD or DVD on the tray by driving it. A sidewall of the CD/DVD drive 24 is approximately L-shaped due to the medium loading section and the medium driving section. A panel forming the end surface 241 of the tray is also approximately L-shaped conforming to the L shape of the sidewall.

The CD/DVD drive 24 alone becomes a unit by itself that can be removably inserted into a housing section of the unit 50 when the unit 50 is assembled (when the notebook PC 10 is assembled). An end of the CD/DVD drive 24 is provided with an opposite connector to be mated with a connector (not shown) of the circuit board 54 when the CD/DVD drive 24 is inserted into the housing section of the unit 50.

The media slot 52 is a drive for accessing a storage medium inserted through the insertion opening 251. As shown in FIG. 8, the media slot 52 is disposed in a position where it vertically overlaps the first rectangular portion 24a and is laterally aligned with the second rectangular portion 24b. Therefore, it is possible to utilize a dent formed by the first and second rectangular portions 24a and 24b—i.e. space formed in a rectangular area surrounding the first and second rectangular portions 24a and 24b. Such space-saving reduces the total thickness of the notebook PC 10 as compared with the example shown in FIG. 9, thereby helping to make the notebook PC 10 small and slim.

3. Battery Unit and Speaker

Figure 10:
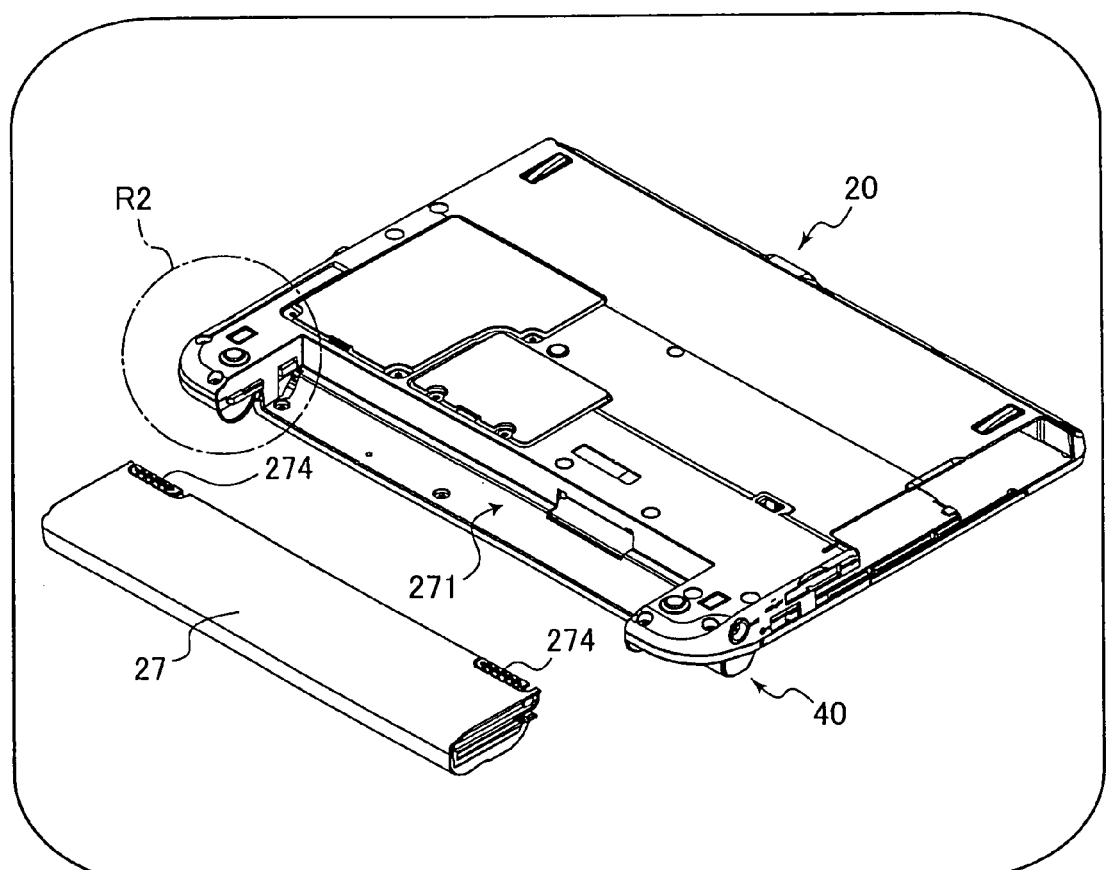
FIG. 10 is a perspective view of a main unit of the notebook PC shown in FIGS. 1 through 4, as viewed from the reverse side of the top surface where a keyboard is disposed.
Figure 11:
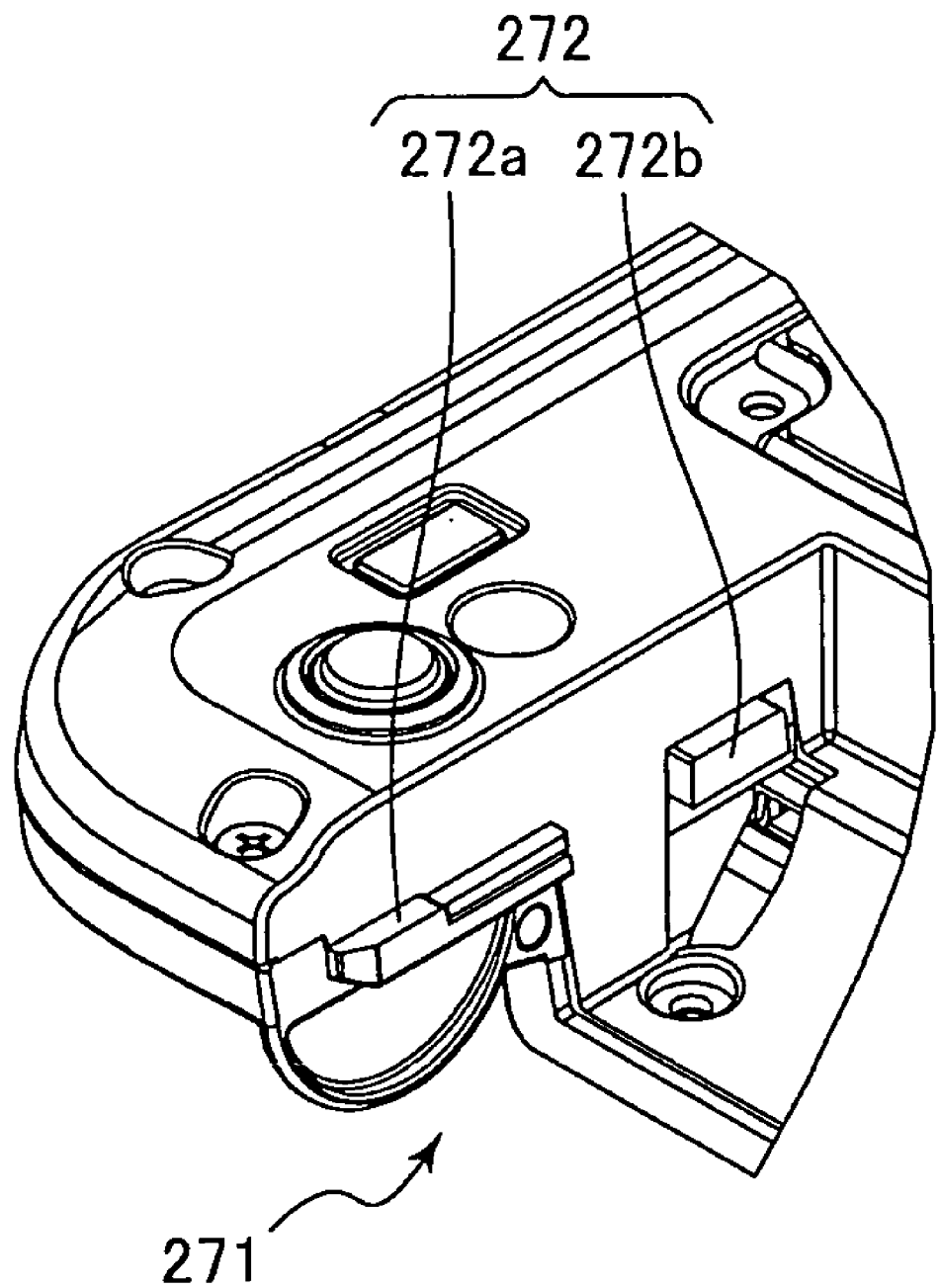
FIG. 11 is an enlarged view of the portion in a circle R2 indicated with a chain line shown in FIG. 10.
Figure 12:
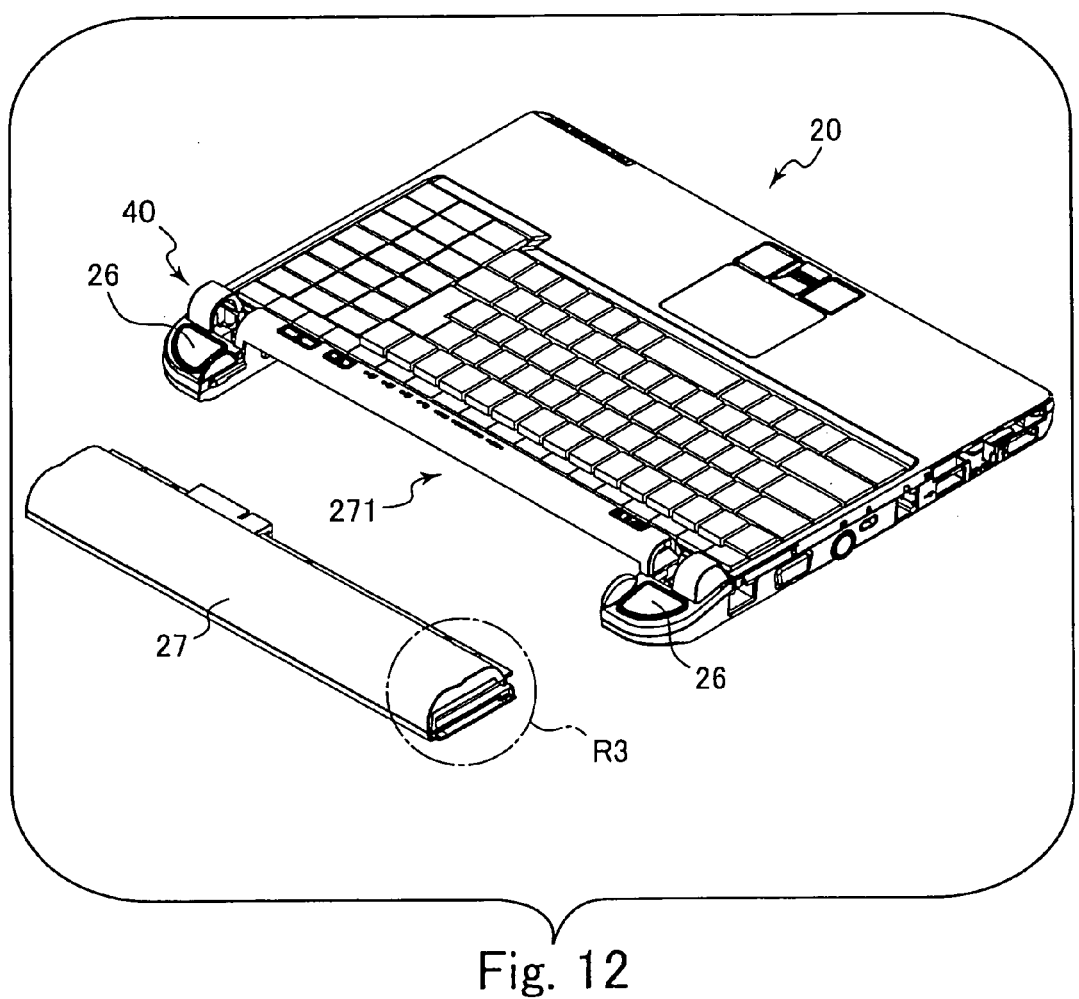
FIG. 12 is a perspective view of the main unit of the notebook PC shown in FIGS. 1 through 4, as viewed from the top surface where the keyboard is disposed.
Figure 13:
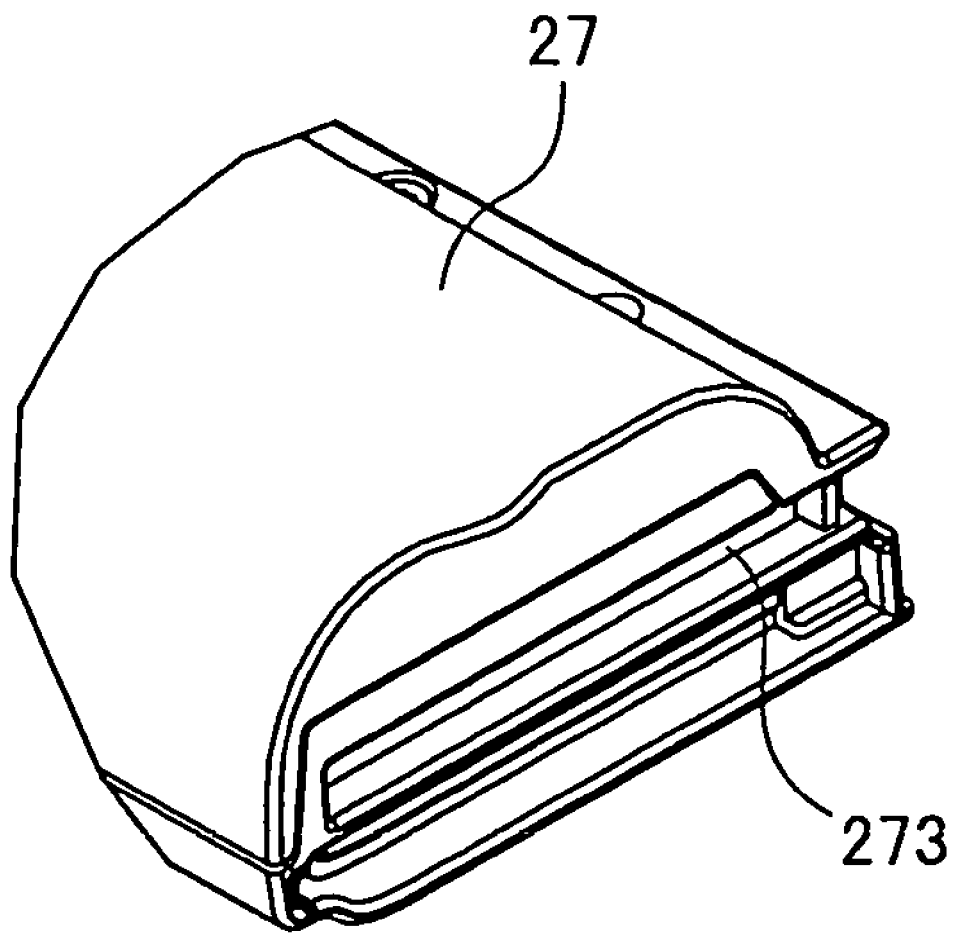
FIG. 13 is an enlarged view of the portion in a circle R3 indicated with a chain line shown in FIG. 12.

FIG. 10 is a perspective view of the main unit 20 of the notebook PC 10 shown in FIGS. 1 through 4, as viewed from the reverse side of the top surface where the keyboard 21 is disposed. FIG. 11 is an enlarged view of the portion in a circle R2 indicated with a chain line shown in FIG. 10. FIG. 12 is a perspective view of the main unit 20 of the notebook PC 10 shown in FIGS. 1 through 4, as viewed from the top surface where the keyboard 21 is disposed. FIG. 13 is an enlarged view of the portion in a circle R3 indicated with a chain line shown in FIG. 12. FIGS. 10 and 12 also show the battery unit 27 detached from the main unit 20. FIG. 11 shows the bottom surface of a speaker-supporting portion of the cabinet forming the main unit 20, which is in the battery-attachment section side. FIG. 13 shows an end surface of the battery unit 27, which is to be attached to the main unit 20.

As mentioned above, behind the hinge section 40, the battery-attachment section 271 is formed, to which the battery unit 27 used for supplying power to components of the notebook PC 10 is removably attached. The external form of the battery unit 27 is nearly a rectangular solid and has a connector that is at least provided with a power terminal at one end in the longitudinal direction. Inside the case of the battery unit 27, there are two or more battery cells wired to the connector. When the battery unit 27 is slid into the battery-attachment section 271 from the back of the main unit 20, the connectors of the both sides are mated with each other. The battery unit 27 is attached to the main unit 20 in this manner. Also, at both ends of the battery-attachment section 271, the speakers 26 are disposed to output sound to the outside.

The portions of the cabinet forming the main unit 20 that support the speakers 26 are so formed as to project towards the back of the main unit 20. These portions project such that the projections become nearly flush with the battery unit 27 when the battery unit 27 is attached to the battery-attachment section 271. In the state that the battery unit 27 is attached to the battery-attachment section 271, the portions of the cabinet forming the main unit 20 that support the speakers 26 are approximately flush with the battery unit 27. In other words, the portions of the cabinet forming the main unit 20 that support the speakers 26 are not covered by the display unit 30 when it is closed to lie on the main unit 20.

A conventional battery unit is attached to a main unit in such a manner that the battery unit alone projects from the cabinet of the main unit—i.e. only about half of the battery unit is attached to the main unit. Therefore, a user often feels that it is unstable. Further, a conventional battery unit is liable to damage during transportation when the connection point between the connectors of the main unit and the battery unit is put under the load of the weight of the battery unit, or when the battery unit hits something. However, according to the present embodiment, the portions of the cabinet forming the main unit 20 that support the speakers 26 project such that the projections become flush with the battery unit 27 when the battery unit 27 is attached to the battery-attachment section 271. Therefore, the stability of the battery unit 27 in an attachment position has been improved. Also, such a structure prevents a load of the weight of the battery unit on the connection point between the connectors of the main unit and the battery unit.

At each end of the battery unit 27, a long groove 273 is formed (see FIG. 13). Each long groove 273 is engaged with corresponding one of projections 272 (see FIG. 11) that are each formed on a sidewall, which faces the battery-attachment section 271, of the portion having the speaker 26 disposed thereon of the cabinet forming the main unit 20. The long groove 273 extends for almost the entire width of the battery unit. Therefore, the battery unit 27 is not only stable but also firmly supported by the main unit 20. In addition, the entire long groove 273 (nearly equals to the entire width of the battery unit 27) supports the battery unit 27, which helps eliminate a load to be applied to the connectors by the weight of the battery unit 27.

Further, as shown in FIG. 11, each of the projections 272 to be engaged in the corresponding long groove 273 of the battery unit 27 is composed of two portions 272a and 272b. When removing the battery unit 27 inserted into the battery-attachment section 271 therefrom, two operation members 274 shown in FIG. 10 are slid to retract claws (not shown) engaged with the projections 272 into the battery unit 27. Because each of the projections 272 is composed of the two portions 272a and 272b and each of the claws is urged by a spring (not shown) to protrude from the battery unit 27, once the claw is retracted for removing the battery unit 27, the claw enters between the portions 272a and 272b after going over the portion 272b and is stopped by the portion 272a. This prevents the battery unit 27 from being pulled out when it remains in this state. When the operation members 274 are operated again to retract the claws, the battery unit 27 can be pulled and finally removed from the battery-attachment section 271. The structure requiring such a two-step removal operation can prevent accidents such as sudden detachment or drop of the battery unit 27 that may occur when the battery unit 27 is removed.

4. Card Ejection Mechanism

Figure 14:
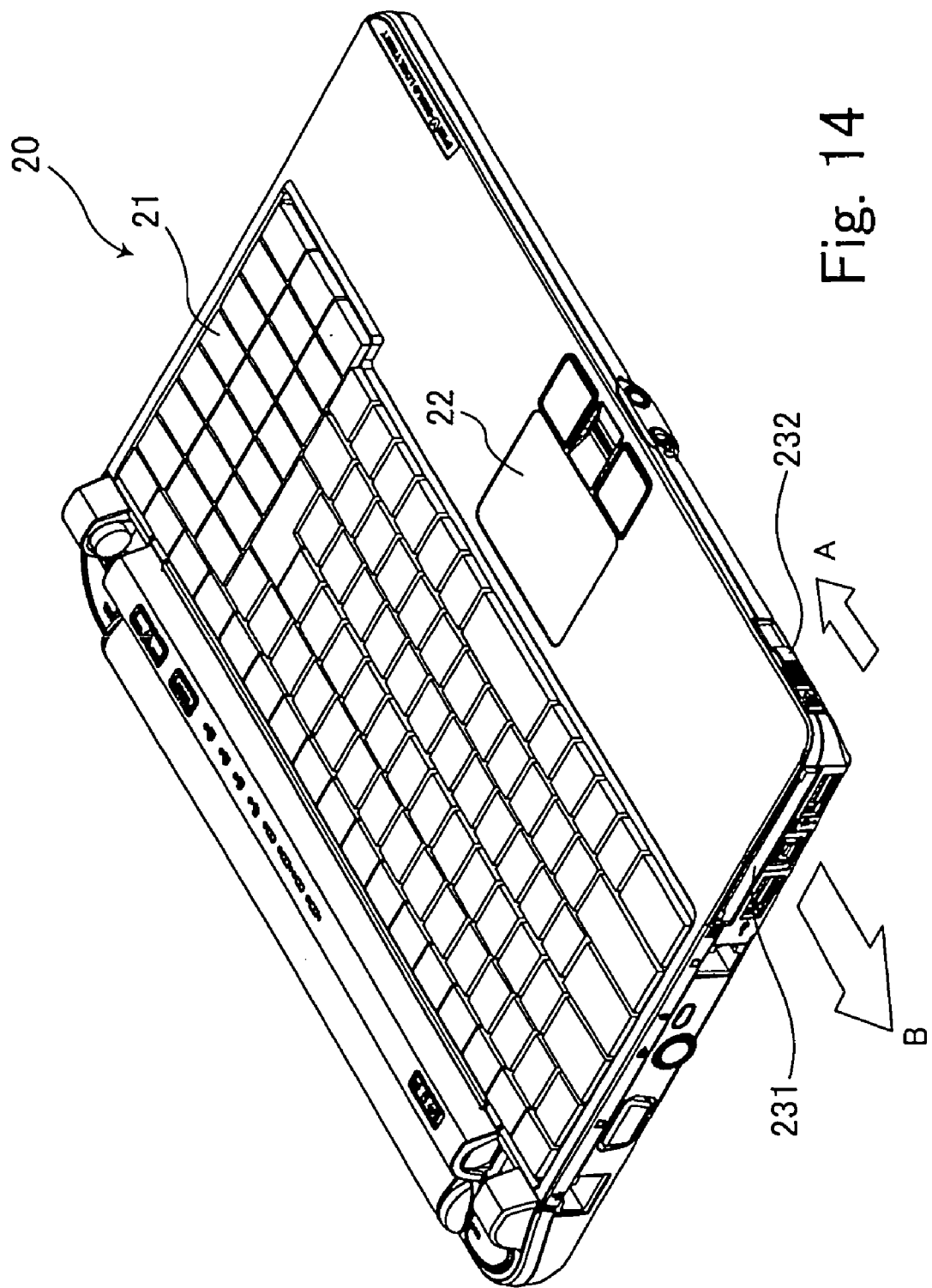
FIG. 14 is a perspective view of the main unit to mainly show a PC card removal operation.
Figure 15:
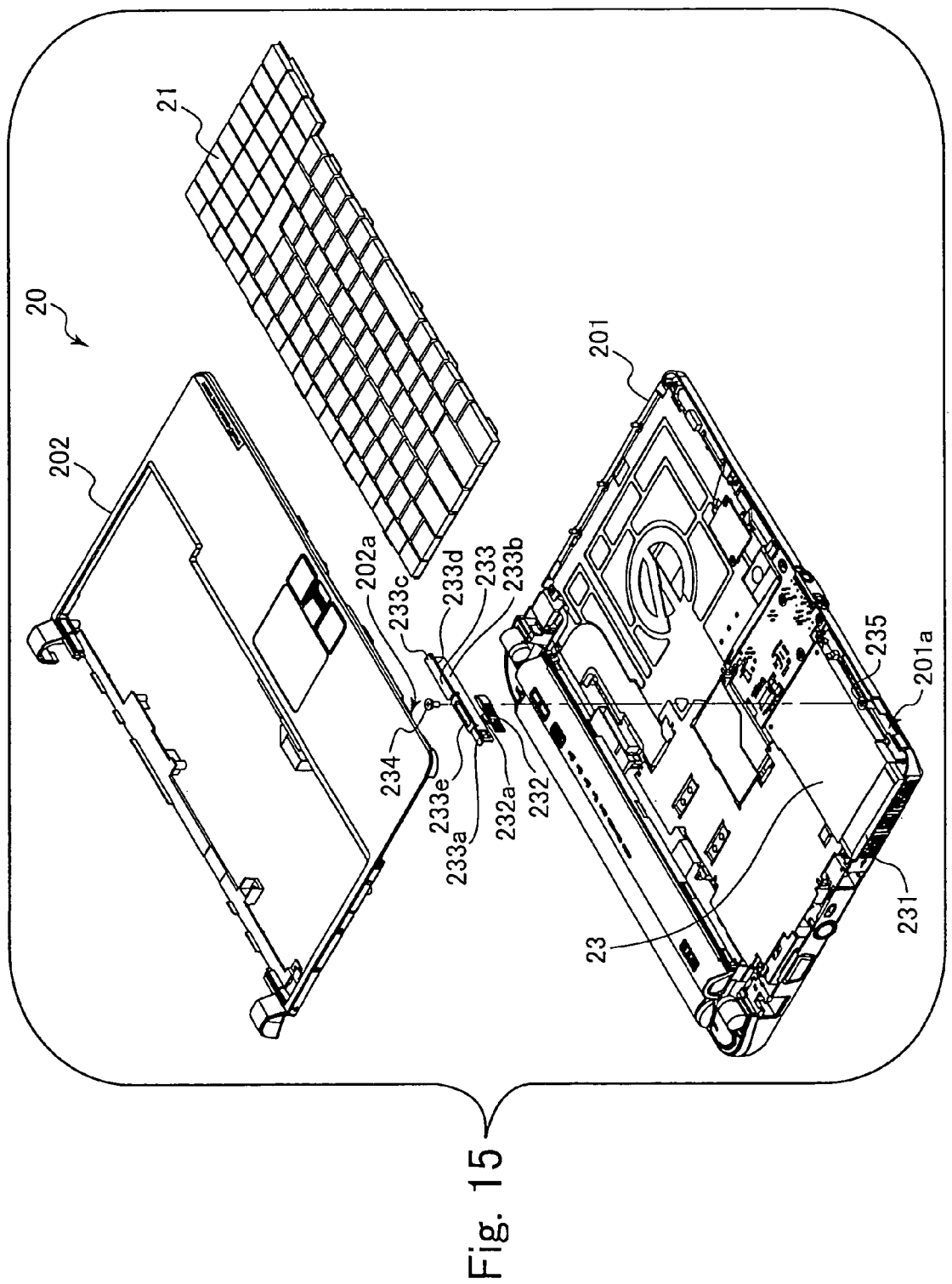
FIG. 15 is an exploded perspective view of the main unit.
Figure 16:
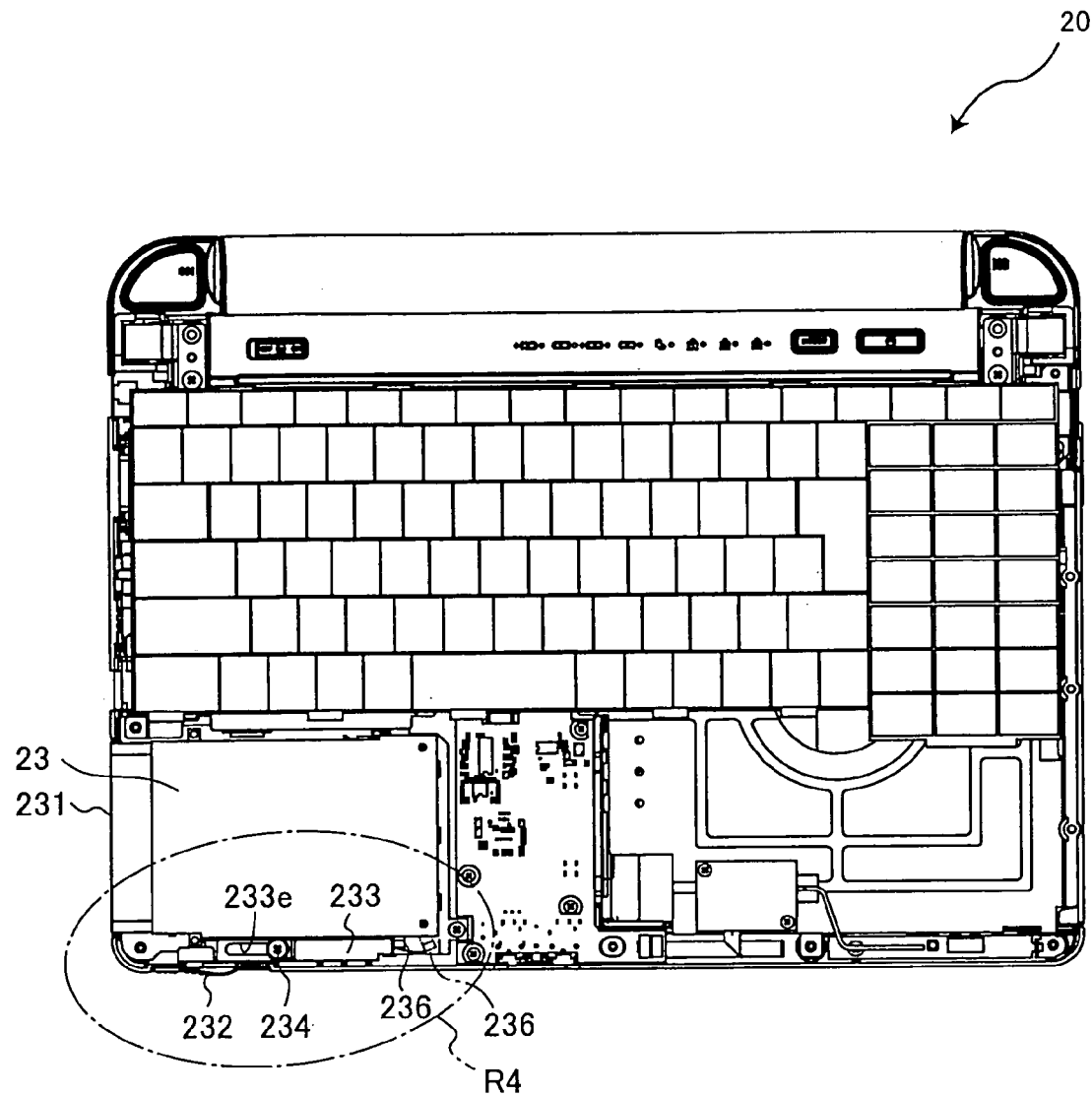
FIG. 16 is a plan view of the main unit with a top cover removed.
Figure 17:
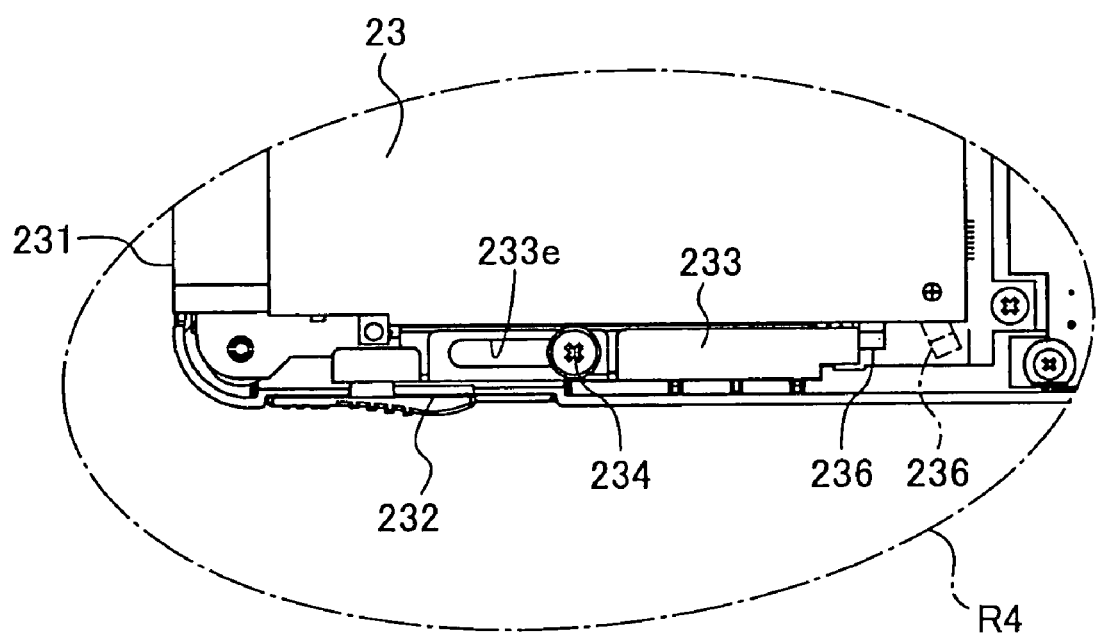
FIG. 17 is an enlarged view of the portion in a circle R4 indicated with a chain line shown in FIG. 16.

FIG. 14 is a perspective view of the main unit 20 to mainly show a PC card removal operation. FIG. 15 is an exploded perspective view of the main unit 20. FIG. 16 is a plan view of the main unit 20 with its top cover removed. FIG. 17 is an enlarged view of the portion in a circle R4 indicated with a chain line shown in FIG. 16.

FIG. 14 also shows the insertion opening 231 of the PC card slot and the operation member 232 to be slidably operated for removing a PC card inserted into the PC card slot. When the operation member 232 is slid in the direction of an arrow A shown in FIG. 14 in a state where a PC card is inserted into the PC card slot, part of the PC card projects from the insertion opening 231 in the direction of an arrow B. By holding and pulling the projecting part with fingers, the PC card can be removed from the PC card slot.

As shown in FIG. 15, the main unit 20 can be disassembled into a bottom cover 201 on which various components including the PC card slot 23 and the like are mounted; the keyboard 21; and the top cover 202 to cover the keyboard 21 mounted on the bottom cover 201. FIG. 15 also shows an ejection mechanism section composed of the operation member 232 and a sliding fitting 233 to engage the operation member 232, which are not assembled.

The bottom cover 201 has an indentation 201a and the top cover 202 also has an indentation 202a in a position corresponding to the indentation 201a. When the bottom cover 201 and the top cover 202 are assembled, an opening defined by the indentations 201a and 202a is formed to connect the inside and outside of the main unit 20.

The operation member 232 has a projecting engagement claw 232a and is disposed on the surface of a cover formed by the bottom and top covers 201 and 202. The engagement claw 232a projects towards the inside of the cover through the opening defined by the indentations 201a and 202a. In contrast, the sliding fitting 233 is disposed inside the cover and has an engagement hole 233a through which the engagement claw 232a of the operation member 232 projecting towards the inside of the cover is inserted. When the operation member 232 is slid, the sliding fitting 233 is also slid together with the operation member 232 along an inner wall of the cover.

The sliding fitting 233 has been bent into an L-shape in cross section. One surface 233b of the sliding fitting 233 can be disposed so as to contact an inner surface of the cover, and a top plate as the other surface 233c has a slit 233e through which a screw 234 can be inserted. The screw 234 is inserted into and secured to a screw hole 235 formed in the center of a boss standing on the bottom cover 201. The sliding fitting 233 is engaged with and supported by the operation member 232, and is further guided by the screw 234 screw-fitted through the slit 233e. Therefore, according to a sliding operation made on the operation member 232, by the guide of the slit 233e, the sliding fitting 233 can be slid together with the operation member 232 in the direction in which an L-shaped ridge 233d of the operation member 232 extends.

As shown in FIG. 17, the PC card slot 23 has a medium eject lever 236. When a PC card (not shown) is inserted into the PC card slot 23 through the insertion opening 231, the medium eject lever 236 is moved by the inserted PC card to a medium insert position indicated with a solid line shown in FIG. 17. When the operation member 232 is slid in the direction of an arrow A shown in FIG. 14, the sliding fitting 233 is slid together with the operation member 232, pushing the medium eject lever 236 until it reaches a medium eject position indicated with a chain line shown in FIG. 17. While moving from the medium insert position indicated with the solid line shown in FIG. 17 to the medium eject position indicated with the chain line shown in FIG. 17, inside the PC card slot 23, the medium eject lever 236 pushes the PC card inserted into the PC card slot 23 in the direction of an arrow B shown in FIG. 14 to a position where part of the PC card projects from the PC card slot 23 so that the projecting part of the PC card can be held and pulled by fingers. The present embodiment employs the sliding fitting 233 bent into the shape of an L and is so configured as to sandwich a wall of the cover of the main unit 20 between the operation member 232 and the sliding fitting 233. Therefore, the walls of the bottom cover 201 and the top cover 202 are used only as a guide for sliding movements and their strength is not used, which enables the cover to be made of thin material, thereby contributing to the size and weight reduction of the notebook PC 10.

Also, the present embodiment is so configured as to move the sliding fitting 233 while preventing its vertical movements by means of the screw 234 in the inside of the cover of the main unit 20. Therefore, the operation member 232 supporting the sliding fitting 233 can be well operated without having a frame for the operation member 232 surrounding the range of movement of the operation member 232. Because there is no need to provide such a frame, the present embodiment can reduce the space by the width of the frame, which contributes to the size reduction of the notebook PC 10.

5. Structure of Connector Section

Figure 18:
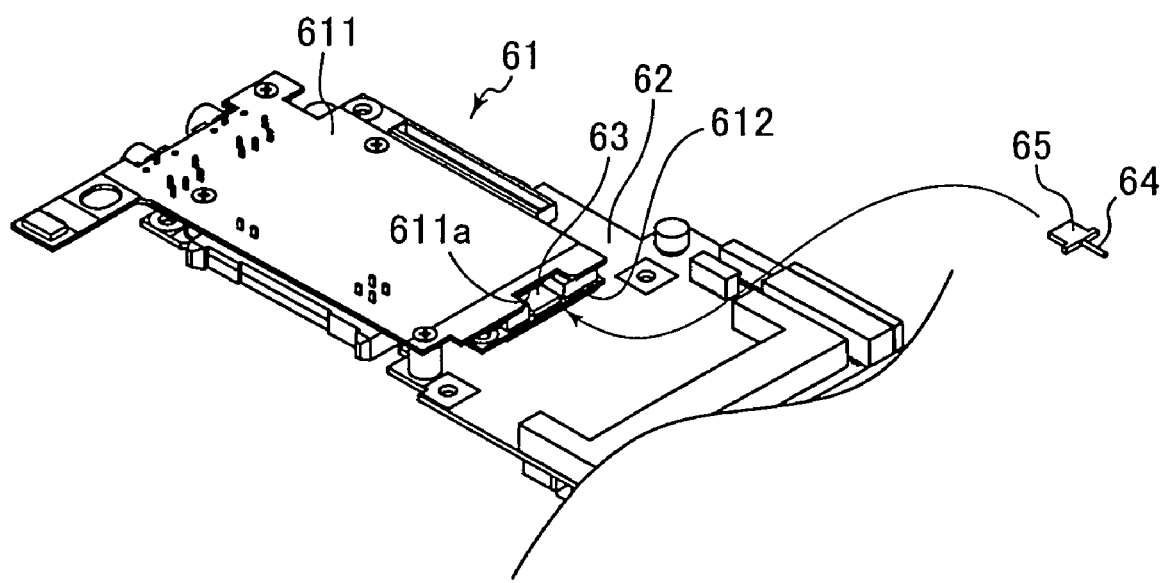
FIG. 18 is a structural perspective view of part of circuit boards and connectors in the main unit.
Figure 19:
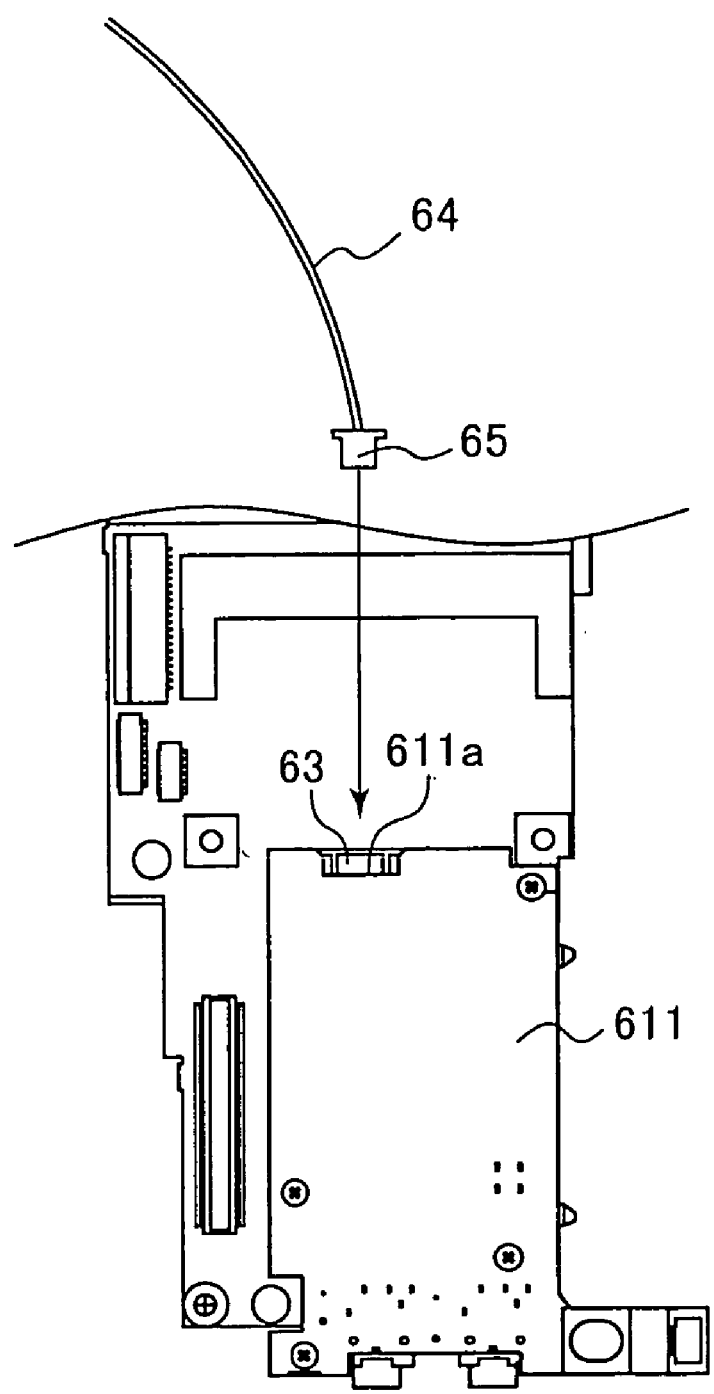
FIG. 19 is a plan view of the same elements shown in FIG. 18 before the connectors are mated with each other.
Figure 20:
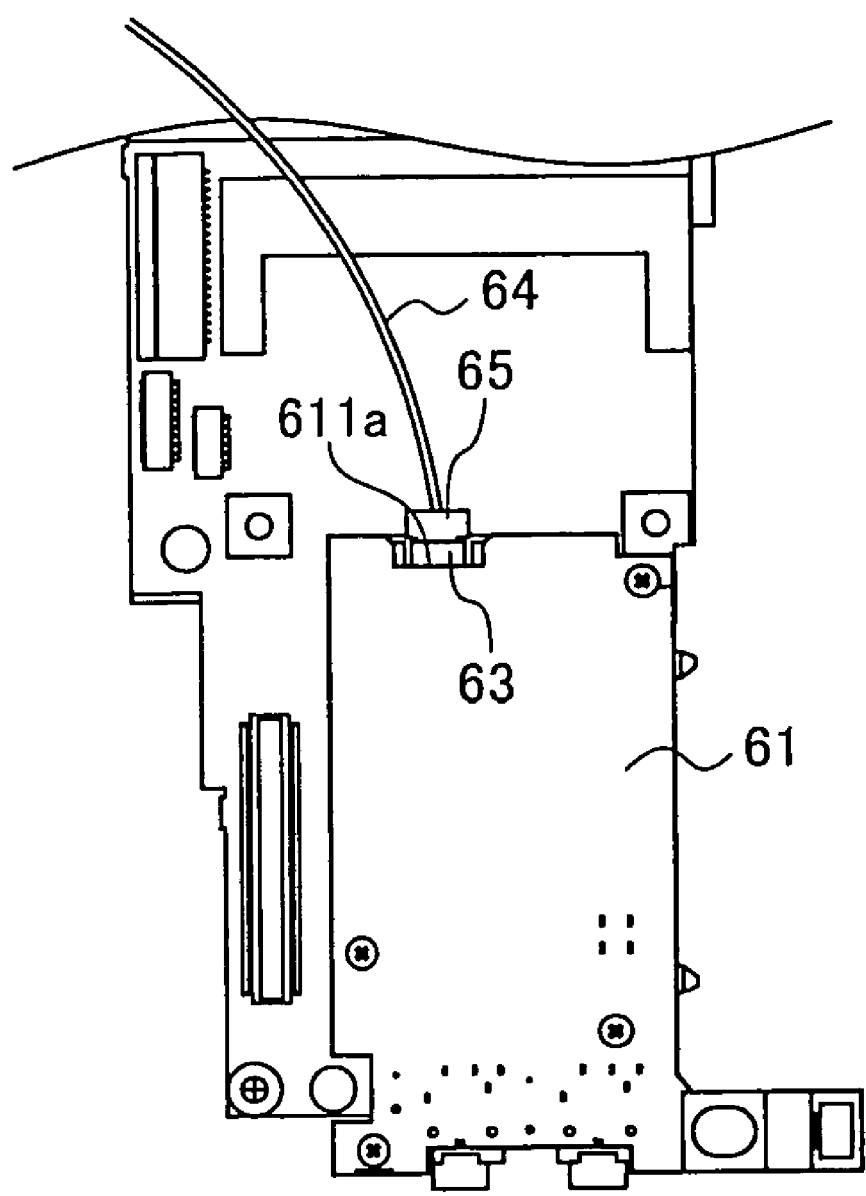
FIG. 20 is a plan view of the same elements shown in FIGS. 18 and 19 when the connectors are mated with each other.

FIG. 18 is a structural perspective view of part of circuit boards and connectors in the main unit. FIG. 19 is a plan view of the same elements shown in FIG. 18 before the connectors are mated with each other. FIG. 20 is a plan view of the same elements shown in FIGS. 18 and 19 when the connectors are mated with each other.

FIG. 18 illustrates a board assembly 61 and a main board 62. The board assembly 61 is composed of two circuit boards 611 and 612 fixed to each other with a predetermined space between them. Of the circuit boards 611 and 612, the circuit board 612 has a connector 63 disposed on a surface facing the circuit board 611 at a position closed to one side of the circuit board 612. The connector 63 is so configured as to be mated with a connector 65 connected to one end of a cable 64. Through these connectors 63 and 65, signals are exchanged between a circuit on these circuit boards and a circuit component (not shown) to which the other end of the cable 64 is connected. The board assembly 61 is fixed to the main board 62 in such a manner that a predetermined space is formed between the board assembly 61 and the main board 62 and that the circuit board 612 having the connector 63 mounted thereon is disposed on the main board 62 side.

Of the circuit boards 611 and 612, the upper circuit board 611 has an indentation 611a for visually observing the connector 63 at a position facing the connector 63 mounted on the lower circuit board 612. Without the indentation 611a, it is extremely hard for a user to observe the connector 63 and thus mating of the connectors 63 and 65 must be carried out with guesswork when the board assembly 61 is fixed to the main board 62, which reduces working efficiency to a great extent. On the contrary, because the indentation 611a is formed in the circuit board 611, a user can observe the connector 63, which remarkably improves working efficiency during mating of the connectors 63 and 65.

6. Affixing Structure of Friction Members

Figure 21:
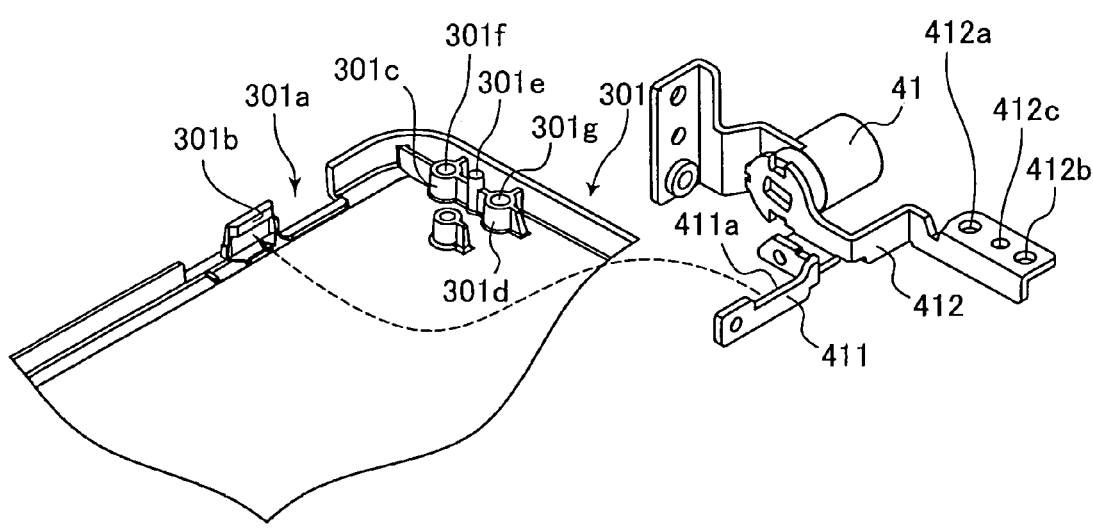
FIG. 21 is an exploded perspective view of the affixing structure of friction members shown in FIG. 1 to be affixed to a back cover of a display unit.
Figure 22:
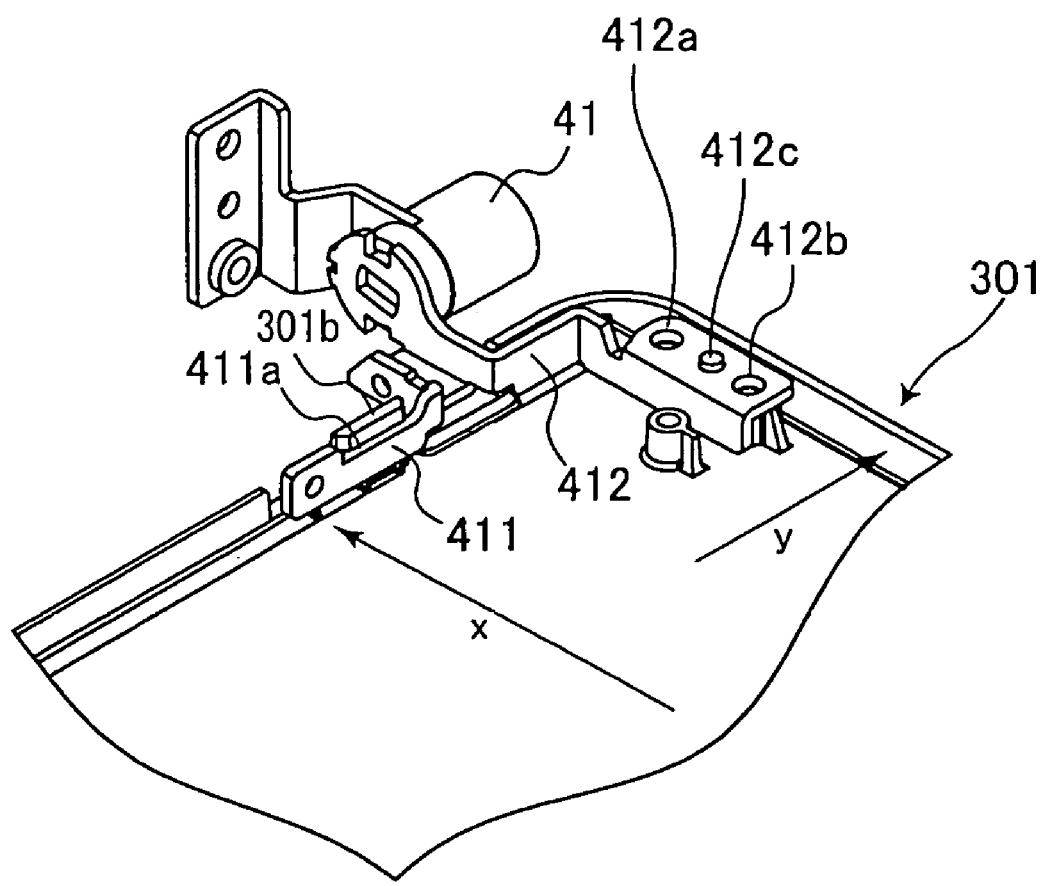
FIG. 22 is a perspective view of the friction member when it is disposed on the back cover.

FIG. 21 is an exploded perspective view of the affixing structure of the friction members 41 shown in FIG. 1 to be affixed to the back cover of the display unit 30, and FIG. 22 is a perspective view of the friction member 41 when it is disposed on the back cover.

Figure 23:
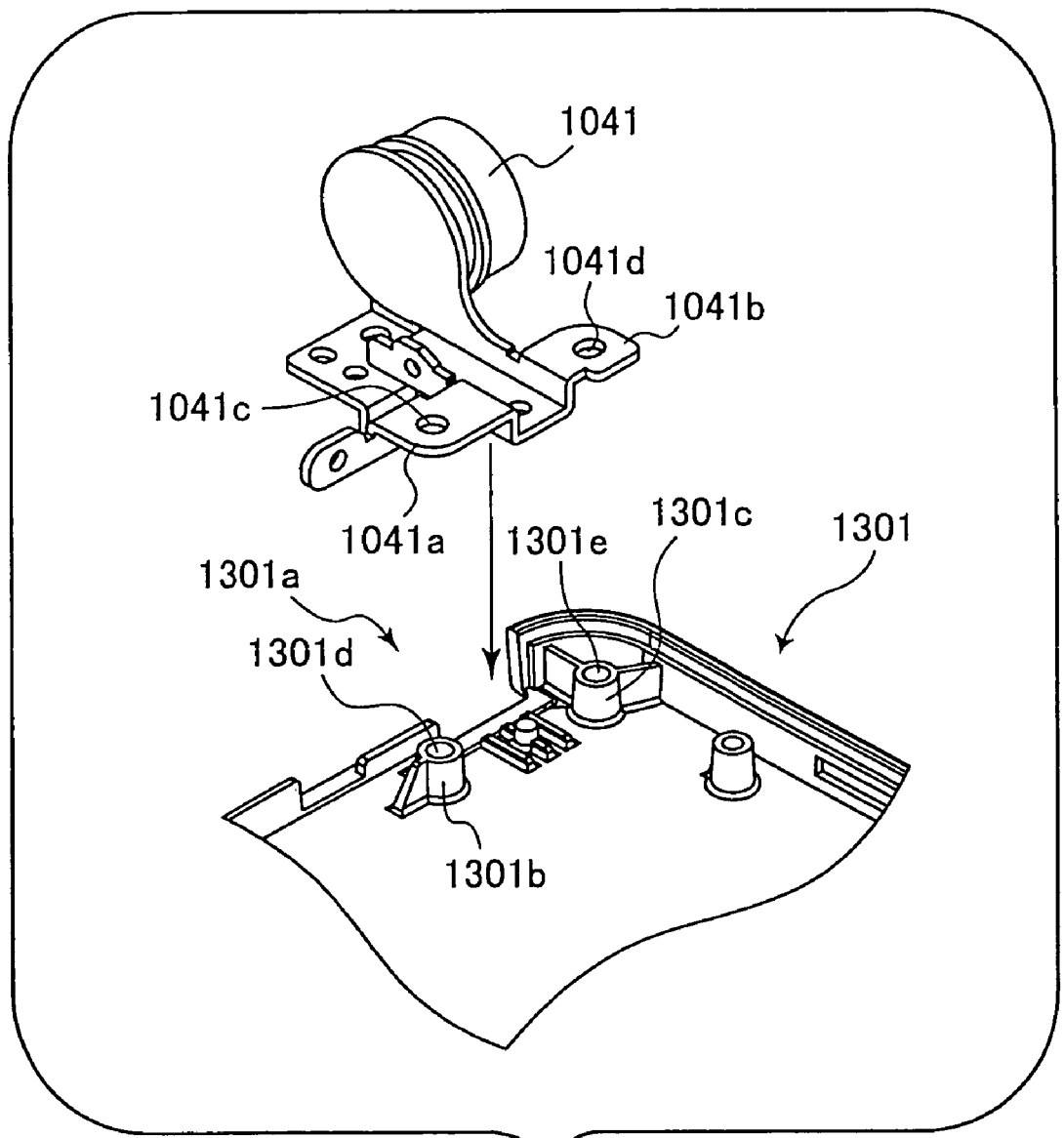
FIG. 23 is an exploded perspective view of the affixing structure of a conventional friction member.
Figure 24:
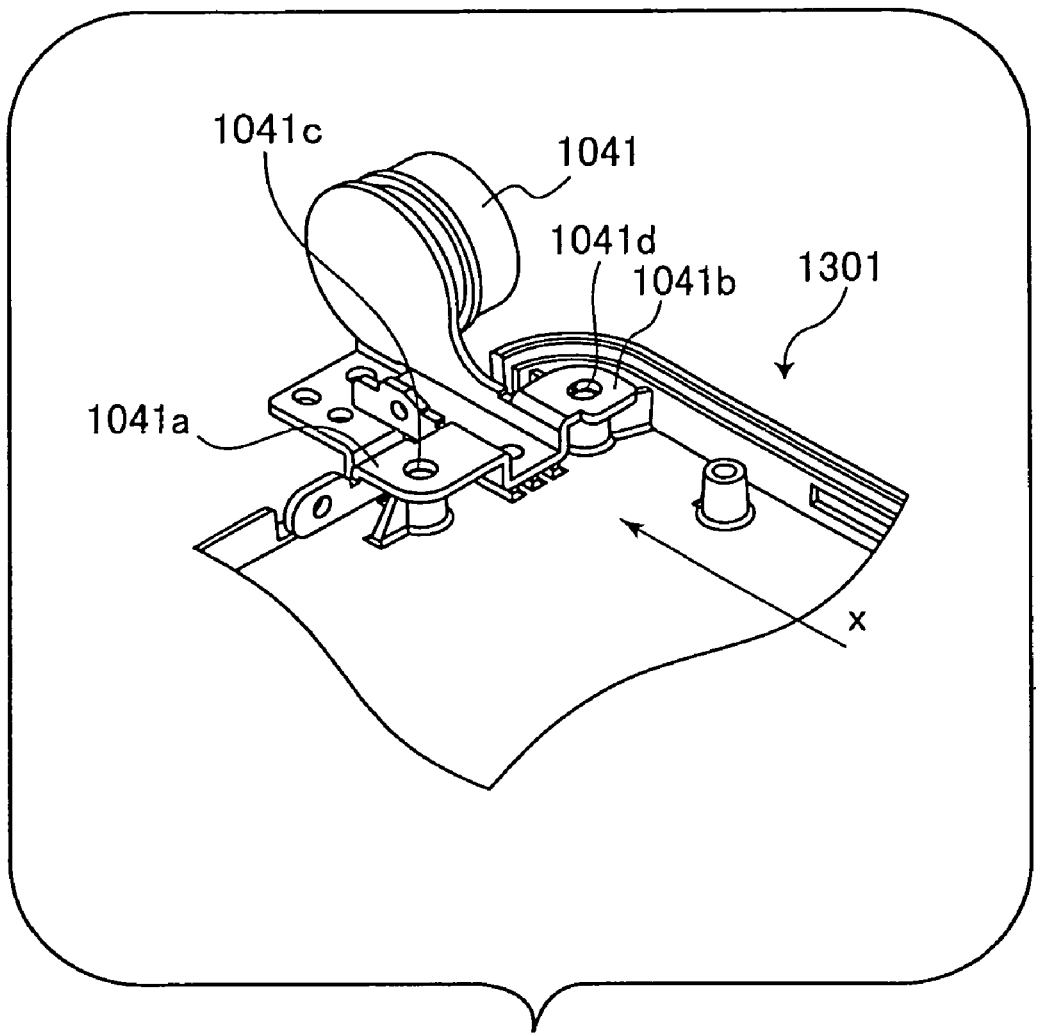
FIG. 24 is a perspective view of the conventional friction member when it is disposed on a back cover.

Also, FIG. 23 is an exploded perspective view of the affixing structure of a conventional friction member, and FIG. 24 is a perspective view of the conventional friction member when it is disposed on a back cover.

FIGS. 21 and 22 illustrate the structure employed by the notebook PC 10 shown in FIGS. 1 through 4 as an embodiment, and FIGS. 23 and 24 illustrate a conventional example for comparison.

The example shown in FIGS. 23 and 24 will be described first.

A back cover 1301 forming a display unit has an indentation 1301a that defines an opening formed when the back cover 1301 is covered by a front cover (not shown) that enables a display screen to be seen. A friction member 1041 is so disposed to extend linking the outside and inside of the back cover 1301 through the indentation 1301a. The friction member 1041 enters the inside of the back cover 1301 from the indentation 1301a and has two arms 1041a and 1041b spreading at both ends. The arms 1041a and 1041b have through holes 1041c and 1041d, respectively. In contrast, the back cover 1301 has bosses 1301b and 1301c over which the through holes 1041c and 1041d of the arms 1041a and 1041b are to be aligned. The bosses 1301b and 1301c have screw holes 1301d and 1301e formed in the center, respectively. The two arms 1041a and 1041b are positioned on the bosses 1301b and 1301c and screwed by using the through holes 1041c and 1041d and the screw holes 1301d and 1301e. In this way, the friction member 1041 is fixed to the back cover 1301. In the example shown in FIGS. 23 and 24, the affixing structure of this example can be employed because the back cover 1301 has sufficient space in the x direction shown in FIG. 24. However, when space is tight in the x direction, for example when a large display module is mounted, the size of the back cover 1301 needs to be increased only for the purpose of such mounting, which contradicts the demand for size reduction of equipment.

Next, the embodiment shown in FIGS. 21 and 22 will be described.

The friction member 41 shown in FIGS. 21 and 22 is fixed inside a back cover 301 of the display unit 30 (see FIG. 1) and extends towards the outside of the back cover 301 through an indentation 301a that defines an opening formed when the back cover 301 is covered by a front cover (not shown).

A part of the friction member 41 entering the inside of the back cover 301 through the indentation 301a is composed of a fist arm 411 and a second arm 412. The first arm 411 enters the inside of the back cover 301 through the indentation 301a and extends along an inner wall of the back cover 301 in the left direction in FIGS. 21 and 22. The second arm 412 enters the inside of the back cover 301 through the indentation 301a and extends along an inner wall of the back cover 301 in the right direction in FIGS. 21 and 22.

The back cover 301 has an engagement projection 301b in a portion where the first arm 411 extends, which projects towards the inside of the back cover 301. The first arm 411 of the friction member 41 has an engagement indentation 411a to be engaged with the engagement projection 301b in a position corresponding to the engagement projection 301b. As shown in FIG. 22, when the friction member 41 is disposed on the back cover 301, the engagement projection 301b of the back cover 301 is engaged in the engagement indentation 411a formed in the first arm 411 of the friction member 41.

In contrast, the second arm 412 of the friction member 41 extending along an inner wall of the back cover 301 is bent into a 90 degree angle, and the bent part has two through holes 412a and 412b and a locating hole 412c in the center between the two through holes 412a and 412b.

The back cover 301 has two bosses 301c and 301d formed at positions where the two through holes 412a and 412b of the second arm 412 of the friction member 41 are to be placed. The bosses 301c and 301d have screw holes 301f and 301g in the center, respectively. In the center between the bosses 301c and 301d, there is formed a standing pin 301e to be inserted into the locating hole 412c formed in the second arm 412 of the friction member 41.

In order to fix the friction member 41 to the back cover 301, as shown in FIG. 22, the engagement projection 301b of the back cover 301 is engaged in the indentation 411a of the first arm 411 of the friction member 41, and the pin 301e of the back cover 301 is inserted into the locating hole 412c of the second arm 412. Then, the two through holes 412a and 412b of the second arm 412 are aligned with the screw holes 301f and 301g of the bosses 301c and 301d. In this state, the friction member 41 is screwed on the back cover 301 by using the through holes 412a and 412b and the screw holes 301f and 301g.

Of the two arms 411 and 412, the one arm 411 is fixed only by engagement and the other arm 412 is fixed by screws and the like in the above-described structure. Accordingly, even when space is tight in the x direction of the back cover 301 shown in FIG. 22, if there is open space in the y direction, it is possible to adopt a flexible affixing structure such as extending an arm to the open space and affixing it there as in the present embodiment.

7. Microphone and Infrared Sensor (Part 1)

As mentioned above, the notebook PC 10 (see FIG. 1) of the present embodiment has a microphone inside the front cover surrounding the display screen 31 of the display unit 30. The front cover has the hole 32 for leading sound to a microphone (not shown) disposed inside thereof. However, the notebook PC 10 of the present embodiment has such a structure that it is capable of containing an infrared sensor for remote-controlling the notebook PC 10 with infrared signals disposed behind the hole 31 instead of a microphone. Both of a microphone-containing structure and an infrared-sensor-containing structure will be described below.

Figure 25:
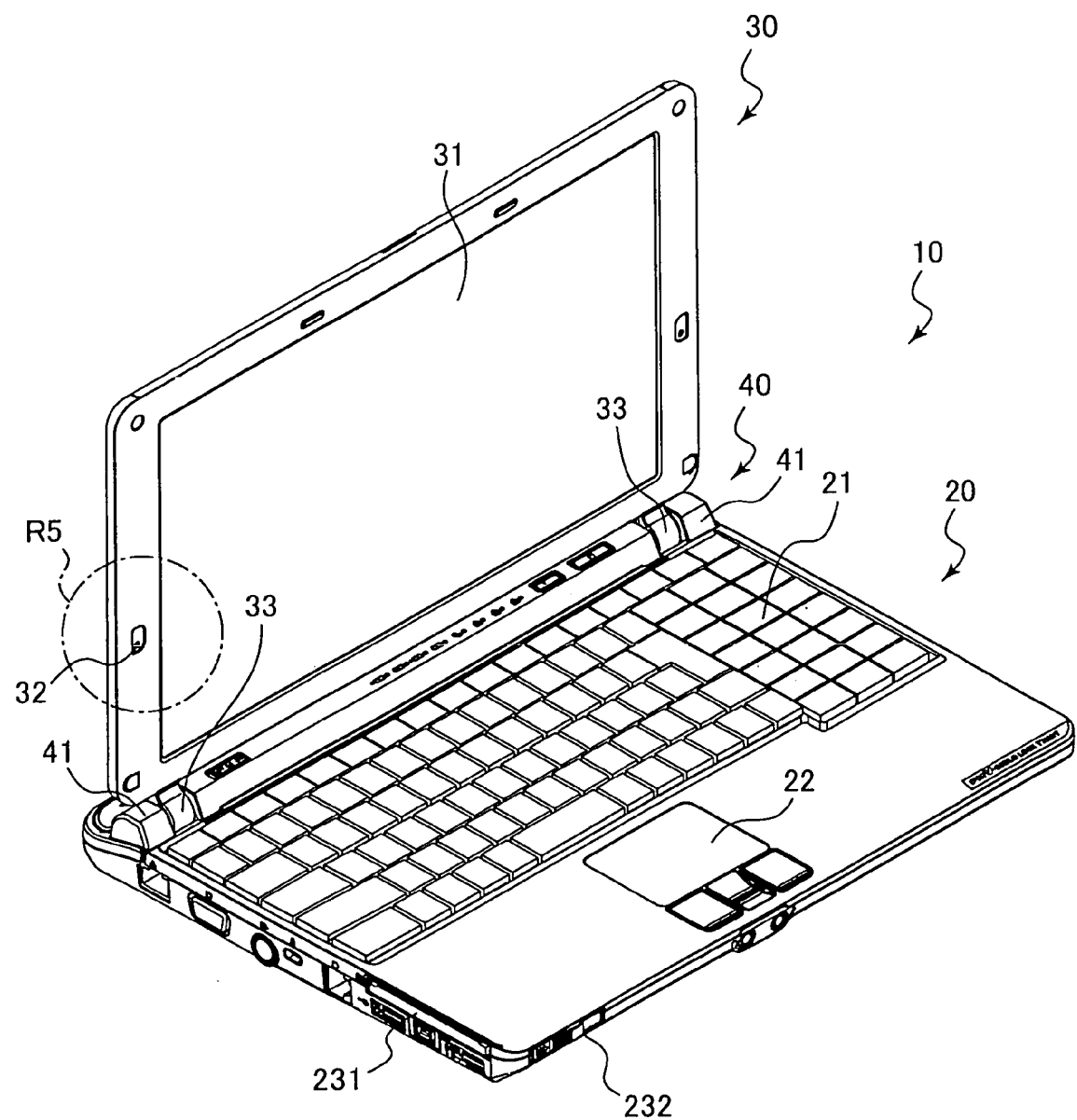
FIG. 25 is an external perspective view of the notebook PC when a microphone is incorporated therein.
Figure 26:
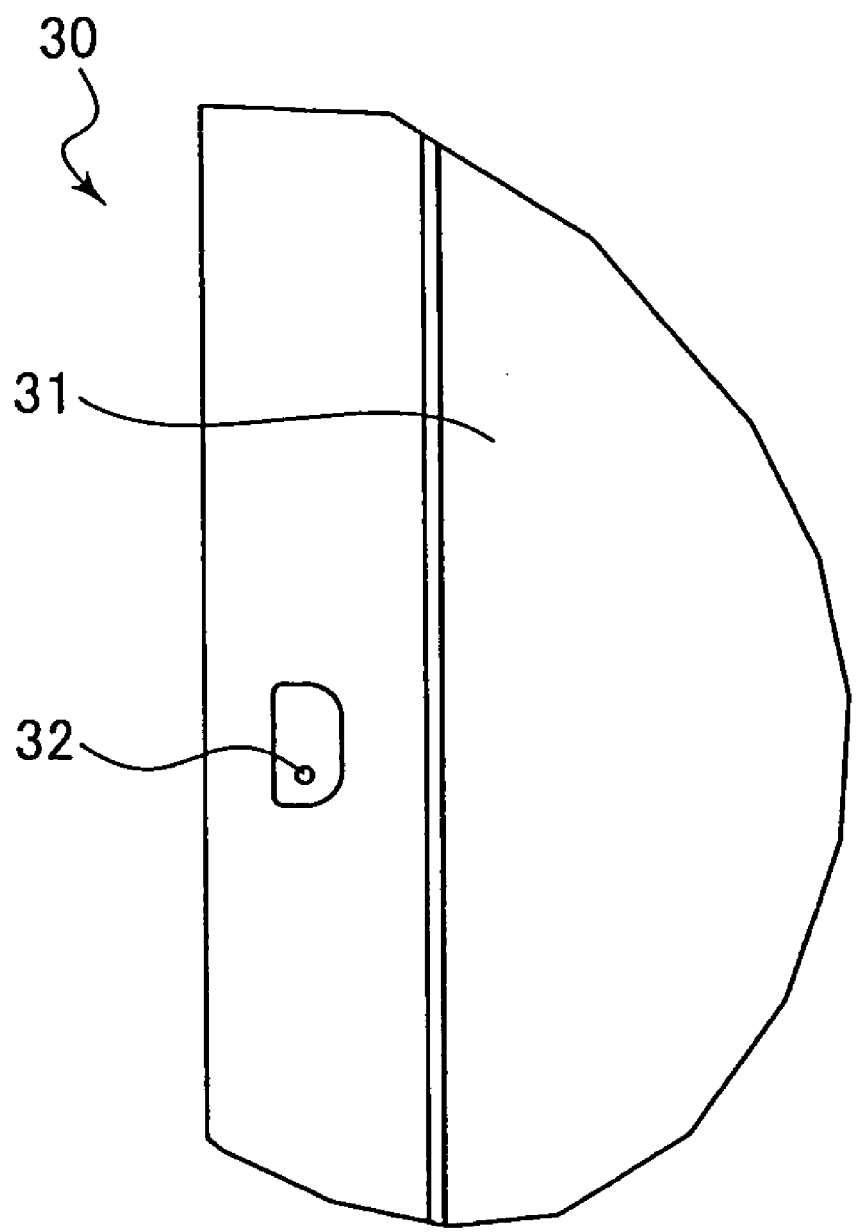
FIG. 26 is an enlarged view of the portion in a circle R5 indicated with a chain line shown in FIG. 25.

FIG. 25 is an external perspective view of the notebook PC when a microphone is incorporated therein, and FIG. 26 is an enlarged view of the portion in a circle R5 indicated with a chain line shown in FIG. 25.

FIG. 25 illustrates, as also shown in FIGS. 1 and 2, the front cover of the display unit 30 has the hole 32 for leading sound to a microphone disposed inside. Incidentally, the hole 32 is formed in a hollow whose shape is approximately equal to the external form of an optical filter 35 as will be described later and whose depth is equal to the thickness of the optical filter 35.

Figure 27:
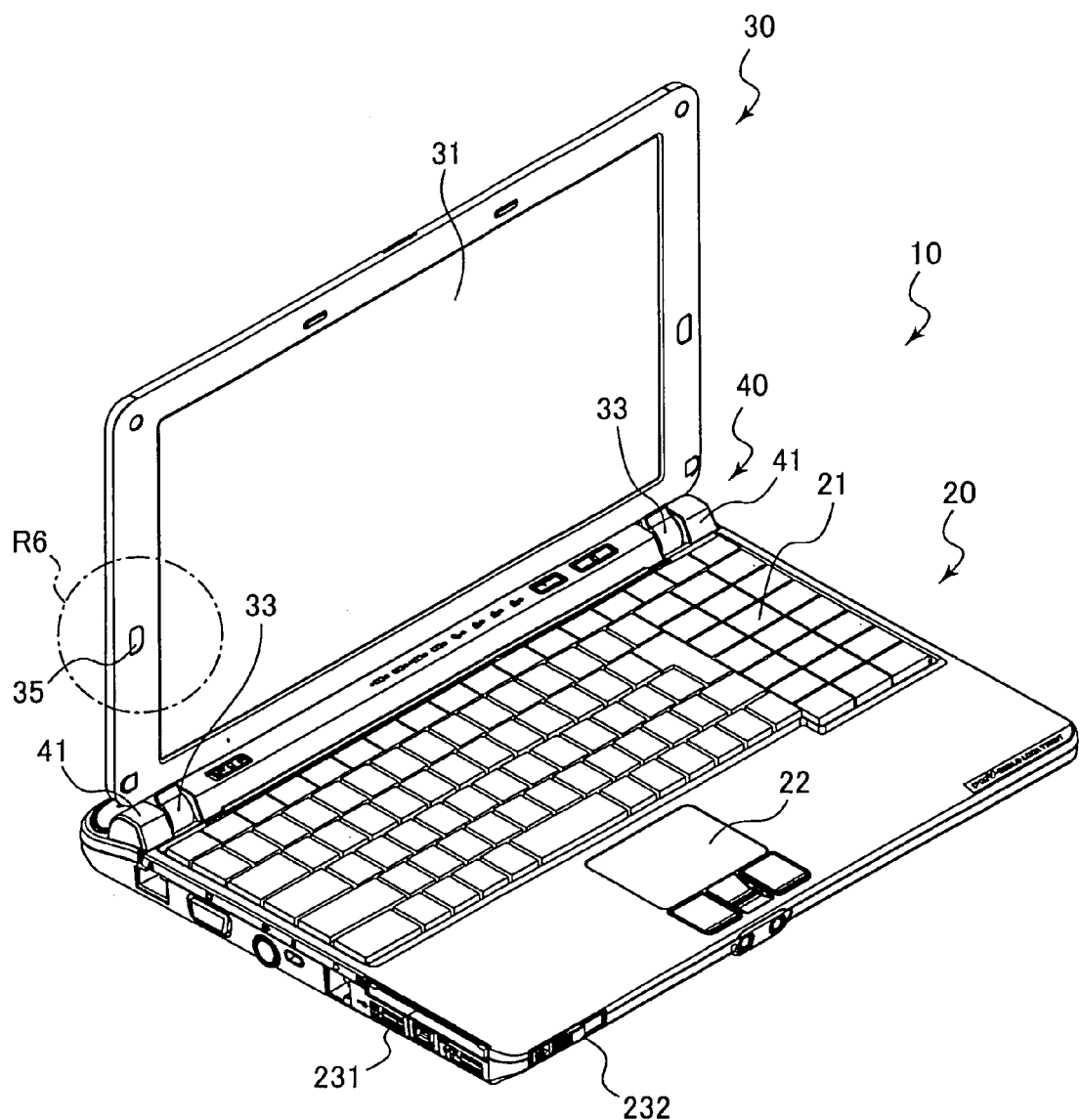
FIG. 27 is an external perspective view of the notebook PC when an infrared sensor is incorporated therein instead of the microphone.
Figure 28:
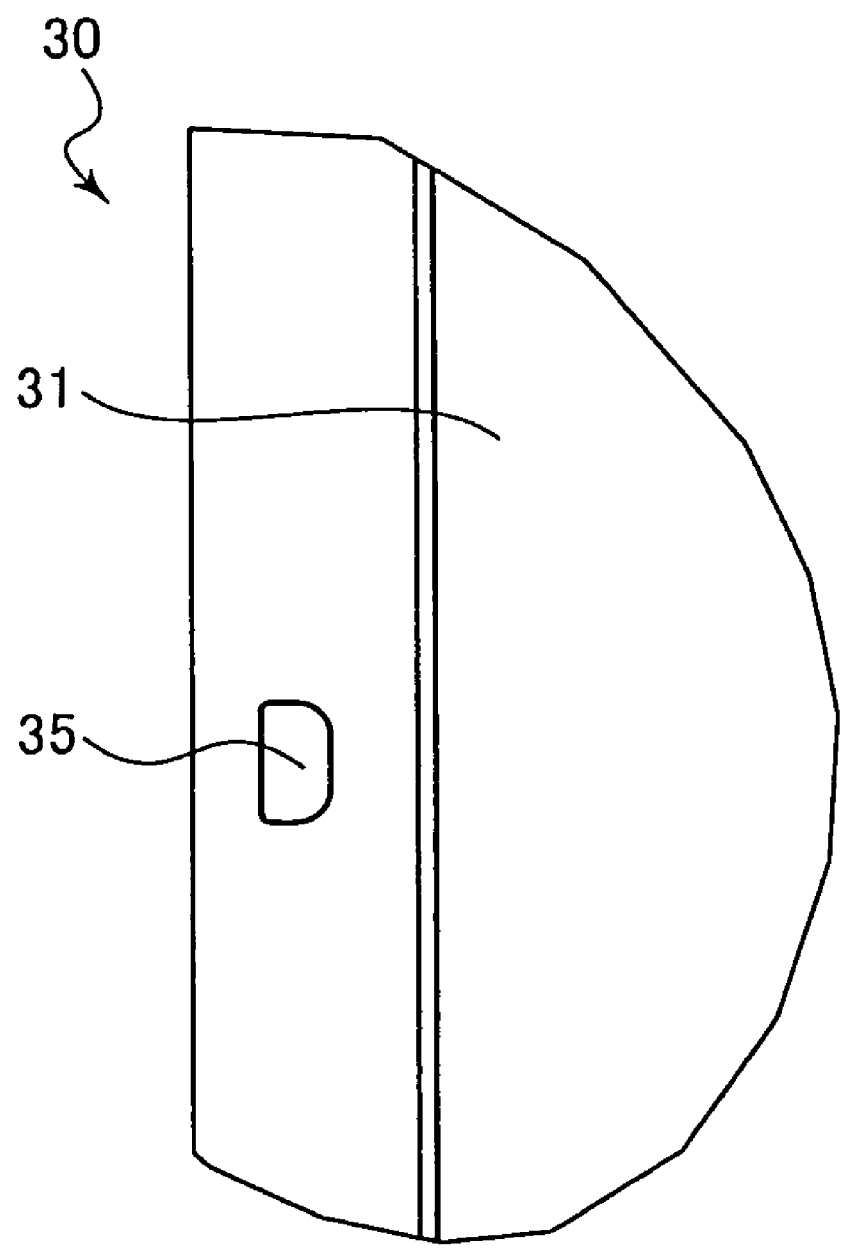
FIG. 28 is an enlarged view of the portion in a circle R6 indicated with a chain line shown in FIG. 27.

FIG. 27 is an external perspective view of the notebook PC when an infrared sensor is incorporated therein instead of the microphone, and FIG. 28 is an enlarged view of the portion in a circle R6 indicated with a chain line shown in FIG. 27.

The optical filter 35 for cutting visible light and transmitting infrared rays is affixed on the hole 32 (see FIGS. 25 and 26). When the optical filter 35 is affixed in the above-described hollow, the front surface of the optical filter 35 is approximately flush with the surface of the front cover of the display unit 30 due to the depth of the hollow, thus providing an excellent design. In addition, the hole 32 shown in FIGS. 25 and 26 becomes invisible when the optical filter 35 is affixed, which prevents dust from entering. The optical filter 35 transmits infrared rays to enable the infrared sensor disposed inside thereof to properly receive infrared signals from a remote controller, and cuts visible light to reduce noise.

Figure 29:
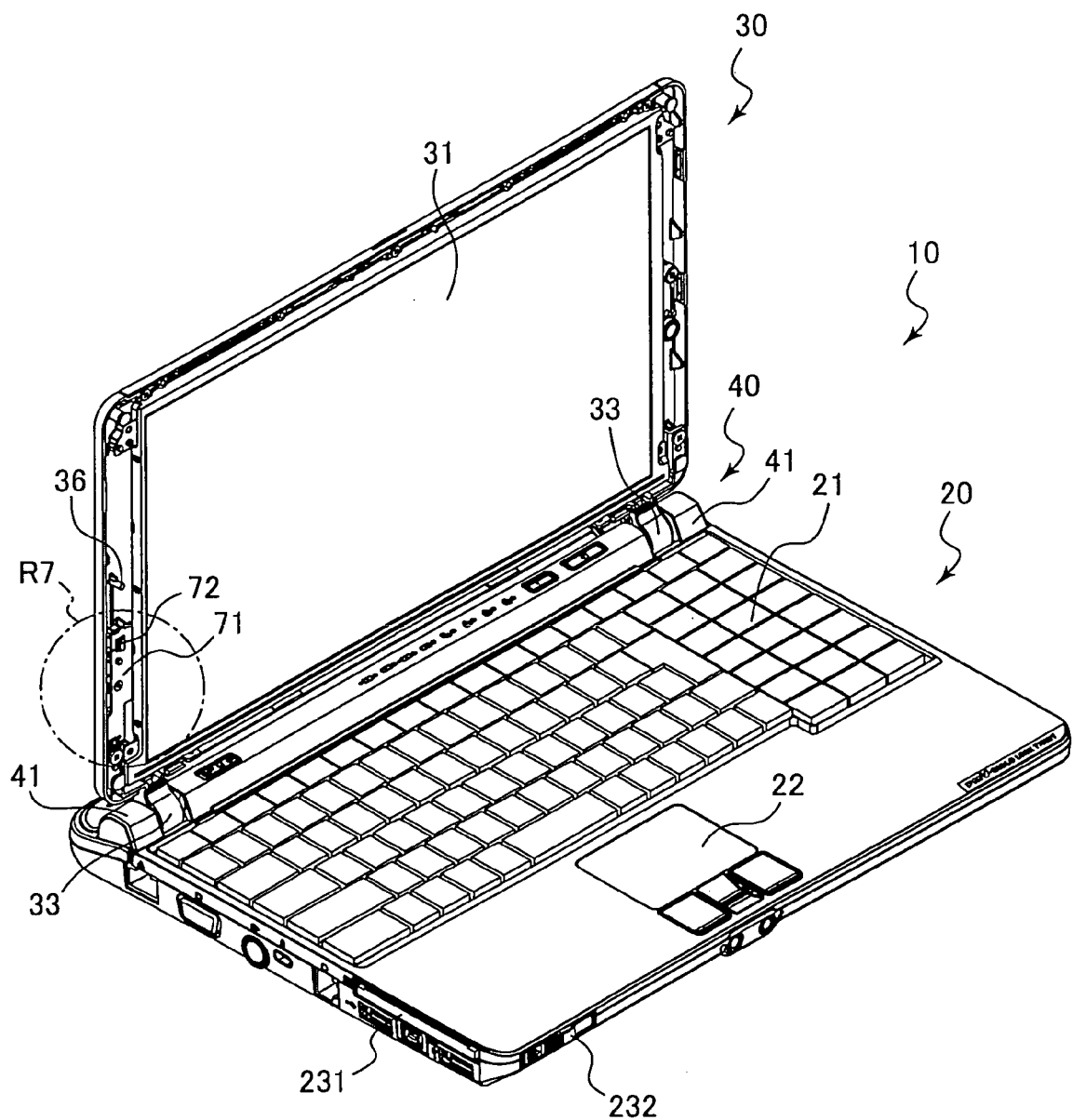
FIG. 29 is an external perspective view of the notebook PC whose front cover surrounding the front surface of a display screen of the display unit is removed.
Figure 30:
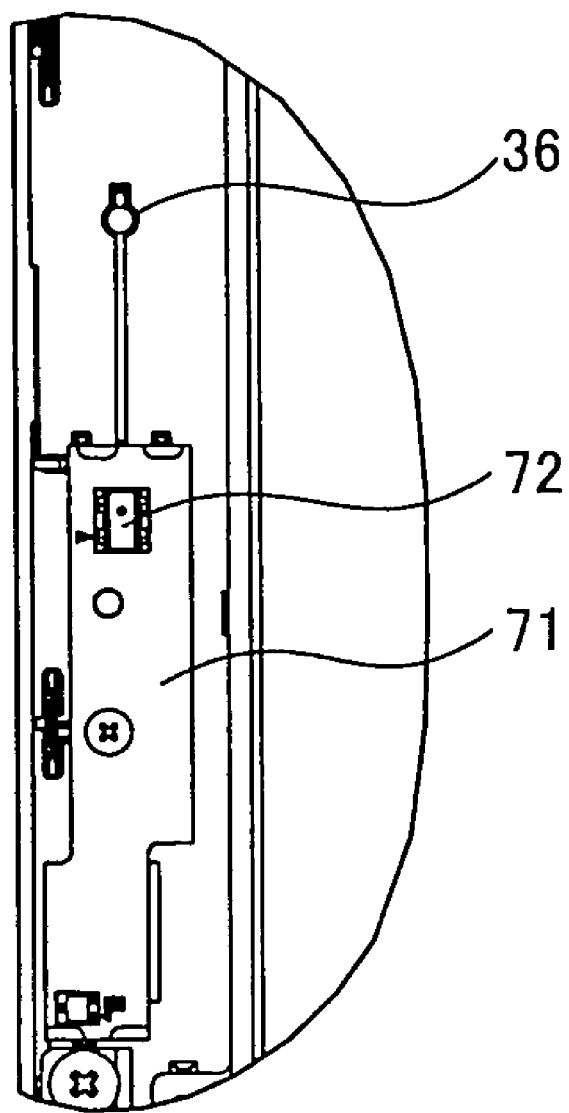
FIG. 30 is an enlarged view of the portion in a circle R7 indicated with a chain line shown in FIG. 29.
Figure 31:
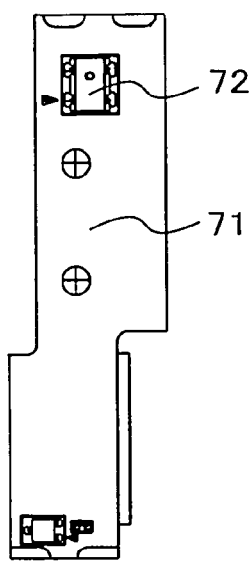
FIG. 31 is a plan view of a circuit board on which an infrared sensor is mounted.
Figure 32:
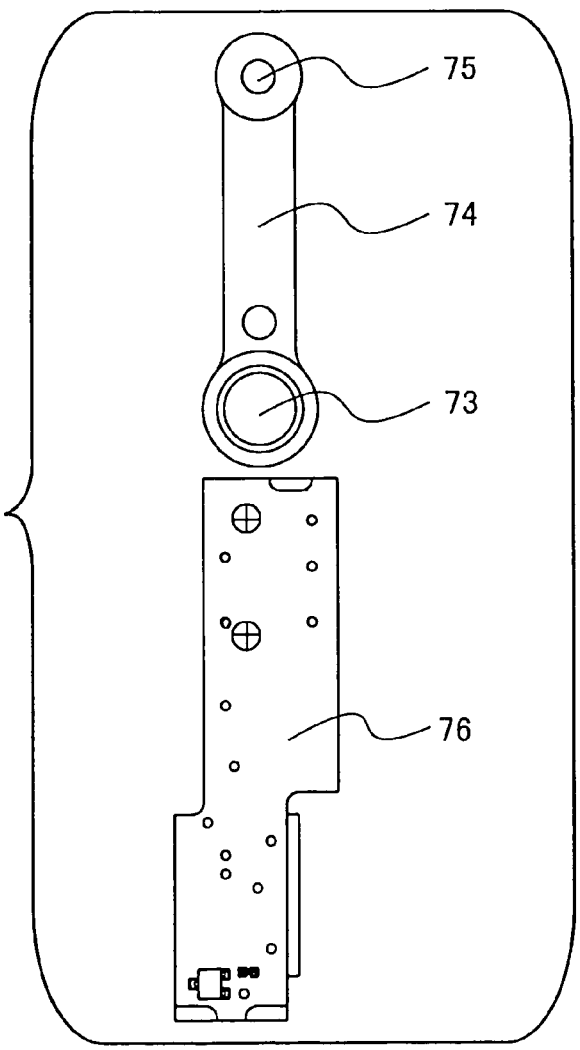
FIG. 32 is a plan view of a microphone unit including a microphone and a circuit board for processing signals picked up by the microphone.

FIG. 29 is an external perspective view of the notebook PC 10 whose front cover surrounding the front surface of the display screen 31 of the display unit 30 is removed. FIG. 30 is an enlarged view of the portion in a circle R7 indicated with a chain line shown in FIG. 29. FIG. 31 is a plan view of a circuit board on which an infrared sensor is mounted. FIG. 32 is a plan view of a microphone unit including a microphone and a circuit board for processing signals picked up by the microphone.

On a circuit board 71, there is mounted an infrared sensor 72 that receives infrared signals used for remote control as shown in FIG. 31. The circuit board 71 is screwed on a position shown in FIGS. 29 and 30 of the display unit 30. At this point, the infrared sensor 72 is positioned behind the hole 32 shown in FIGS. 25 and 26 and receives infrared signals passing through the optical filter 35 (see FIGS. 27 and 28) and the hole 32 (see FIGS. 25 and 26). Signals received by the infrared sensor 72 are processed by a circuit on the circuit board 71 and the notebook PC operates according to the received signals.

When a microphone is disposed behind the hole 32 shown in FIGS. 25 and 26, there are used a microphone unit 74 having a microphone 73 and a circuit board 76 having thereon a circuit for processing signals received by the microphone 73. The microphone unit 74 has a locating hole 75 into which a dowel 36 (see FIG. 30) formed on the display unit 30 is to be inserted. When the microphone unit 74 is positioned in such a manner that the dowel 36 enters the hole 75, the microphone 73 comes to a position just behind the hole 32 shown in FIGS. 25 and 26. The microphone 73 and the circuit board 76 are connected with a cable (not shown), and the circuit board 76 is screwed in a position right below the microphone unit 74.

Whether to contain a microphone or an infrared sensor is selected depending on the destination either of domestic or overseas at the time the notebook PC is assembled. However, such selection may be made depending on the grade of the notebook PC instead of the destination.

As described above, the present embodiment is so configured as to dispose either one of two or more types of components (microphone and infrared sensor in the embodiment) that interact with the outside through the same hole 32 in different manners. Accordingly, there is no need to provide an additional hole, which makes the notebook PC excellent in design.

In addition, because the hole 32 is formed in the front cover of the display unit 30, the hole 32 is in a higher position when the display unit 30 is opened, thereby providing excellent sound-collecting effect of the microphone as well as excellent receiver sensitivity of the infrared sensor.

8. Microphone and Infrared Sensor (Part 2)

Next, there will be described another arrangement of microphone and infrared sensor, which can be employed instead of the arrangement of microphone and infrared sensor described with reference to FIGS. 25 through 32.

Figure 33:
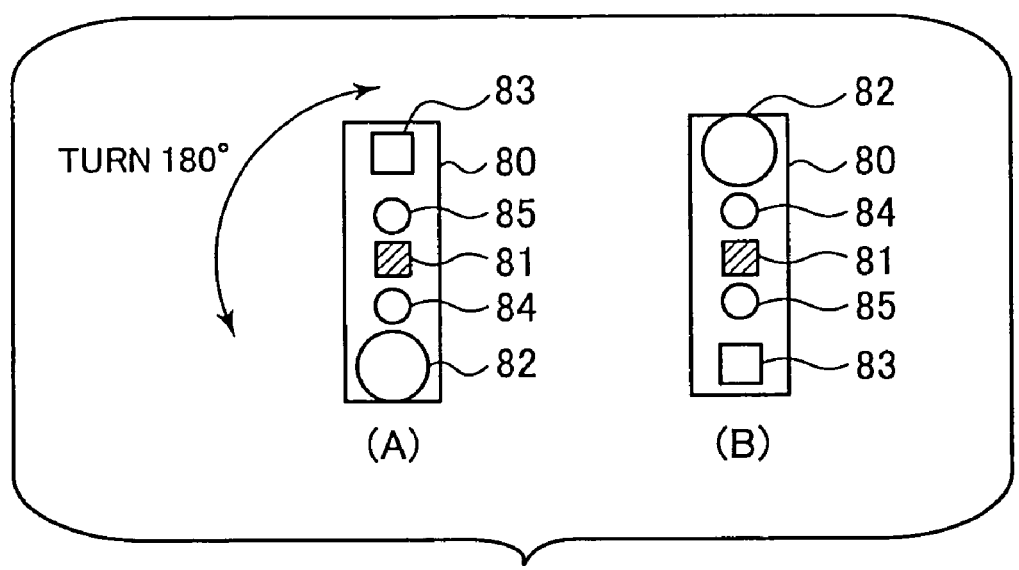
FIG. 33 is a plan view of a circuit board on which a microphone and an infrared sensor are both mounted.

FIG. 33 is a plan view of a circuit board on which a microphone and an infrared sensor are both mounted. Parts (A) and (B) of FIG. 33 illustrate the same circuit board opposite in the vertical direction.

In the center of a circuit board 80, a magnetic sensor 81 for detecting contact and non-contact of a magnetic member is disposed. In addition, a microphone 82 is disposed at one end of the circuit board 80, whereas an infrared sensor 83 for receiving infrared signals used for remote control is disposed at the other end of the circuit board 80. Further, the circuit board 80 has two through holes 84 and 85 for screwing the circuit board 80, which are formed between the magnetic sensor 81 and the microphone 82 and between the magnetic sensor 81 and the infrared sensor 83, respectively. When the circuit board 80 is rotated 180 degrees about the magnetic sensor 81, the through holes 84 and 85 change places so that the magnetic sensor 81 can be screwed in the same position. At this time, the microphone 82 and the infrared sensor 83 also change places.

FIG. 34 is a plan view of the display unit 30 of the notebook PC. Part (A) of FIG. 34 illustrates the display unit 30 in a state when the front cover surrounding the display unit 31 is removed, and Part (B) of FIG. 34 illustrates the display unit 30 in a state when the front cover is fixed thereto.

The back cover of the display unit 30 has two screw holes 38 and 39 for fixing the circuit board 80. Fixing is made by aligning these two screw holes 38 and 39 with the two through holes 84 and 85 of the circuit board 80 and screwing by using these holes. With this arrangement, the magnetic sensor 81 can be disposed in the same position irrespective of the orientation of the circuit board 80, and the microphone 82 or the infrared sensor 83 can be disposed behind the hole 32 depending on the orientation of the circuit board 80. When the circuit board 80 is screwed in the direction in which the infrared sensor 83 is disposed behind the hole 32, an optical filter for transmitting infrared rays and cutting visible light is affixed on the hole 32. On the main unit 20 (see FIGS. 1 and 2) of this notebook PC, a magnetic member (not shown) is disposed in a position corresponding to the magnetic sensor 81 on the circuit board 80. When the display unit 30 is closed to lie on the main unit 20, the magnetic sensor 81 detects the magnetic member and the main unit 20 recognizes the fact that the display unit 30 is closed. When the display unit 30 is opened with respect to the main unit 20, the magnetic sensor 81 does not detect the magnetic member and the main unit 20 recognizes the fact that the display unit 30 is opened. Such recognition of opening and closing is utilized for power supply to the notebook PC, mode switching, etc.

Only either one of the microphone 82 and the infrared sensor 83 is used for one notebook PC according to the orientation of the circuit board 80.

According to the arrangement described with reference to FIGS. 33 and 34, the same circuit board can be used irrespective of destination and grade, which can reduce the number of components to be controlled and can reduce costs by sharing a component. In addition, such an arrangement is excellent in design as compared with a case where two holes are formed for a microphone and an infrared sensor in spite of the fact that only one hole is used.

What is claimed is:

1. An electronic apparatus comprising:
 a board assembly including two circuit boards fixed to each other with predetermined space formed between the circuit boards;
 a first connector disposed on a surface of one of the circuit boards facing the other one of the circuit boards, the first connector being disposed at one end of the surface; and
 a second connector connected to an end of a cable and capable of mating with the first connector,
 wherein the other one of the circuit boards has an indentation for visually observing the first connector at a portion facing the first connector.

2. An electronic apparatus according to claim 1, further comprising a main circuit board on which an electronic component is mounted,
 wherein the board assembly is fixed on the main board such that a predetermined space is formed between the board assembly and the main board, and the one of the circuit boards is disposed on the main circuit board side.

3. A board assembly comprising:
 a first circuit board;
 a second circuit board fixed to the first circuit board with predetermined space formed between the first and second circuit boards; and
 a connector disposed on a surface of the first circuit board facing the second circuit board, the connector being disposed at one end of the surface,
 wherein the second circuit board has an indentation for visually observing the connector at a portion facing the connector.

4. A board assembly according to claim 3, wherein the board assembly is fixed on a main board having mounted thereon an electronic component to be installed in an electronic apparatus, the board assembly being fixed on the main board such that a predetermined space is formed between the board assembly and the main board, and the first circuit board is disposed on the main circuit board side.

5. An electronic apparatus comprising:
 a board assembly including first and second planar circuit boards arranged substantially parallel to and overlapping each other but with a first predetermined space formed between first and second respective facing surfaces of the first and second circuit boards;
 a first connector disposed in the first space on the first facing surface of the first circuit board at an end of the first surface; and
 a second connector connected to an end of a cable and capable of mating with the first connector,
 wherein the second circuit board has an opening formed in an edge thereof which allows for visually observing the first connector from a direction perpendicular to the planes of the first and second circuit boards.

6. An electronic apparatus according to claim 5, further comprising a main circuit board on which an electronic component is mounted,
 wherein the board assembly is fixed on the main board such that a second predetermined space is formed between the board assembly and the main board, and the first circuit board is disposed on the main circuit board side.

7. A board assembly comprising:
 a first planar circuit board;
 a second planar circuit board fixed substantially parallel to and overlapping the first circuit board, but with a first predetermined space formed between first and second respective facing surfaces of the first and second circuit boards; and
 a connector disposed in the first space on the first facing surface of the first circuit board at an end of the first surface,
 wherein the second circuit board has an opening formed in an edge thereof which allows for visually observing the connector from a direction perpendicular to the planes of the first and second circuit boards.

8. A board assembly according to claim 7, wherein the board assembly is fixed on a main board having mounted thereon an electronic component to be installed in an electronic apparatus, the board assembly being fixed on the main board such that a second predetermined space is formed between the board assembly and the main board, and the first circuit board is disposed on the main circuit board side.

9. An electronic apparatus comprising:
 a board assembly including first and second planar circuit boards spaced from and arranged substantially parallel and overlapping each other;
 a first connector disposed between the first and second circuit boards in the space; and
 a second connector capable of mating with the first connector,
 wherein one of the first and second circuit boards has an opening formed over the first connector in a direction perpendicular to the planes of the first and second circuit boards to allow for visually observing a portion of the first connector from the perpendicular direction.

10. An electronic apparatus according to claim 9, further comprising a main circuit board on which an electronic component is mounted,
wherein the board assembly is fixed on the main board such that a space is formed between the board assembly and the main board, and one of the first and second circuit boards is disposed on the main circuit board side.

11. A board assembly comprising:
a first circuit board;
a second circuit board spaced from the first circuit board and arranged substantially parallel and overlapping relative to the first circuit board; and
a connector disposed between the first and second circuit boards in the space,
wherein one of the first and second circuit boards has an opening formed over the connector in a direction perpendicular to the planes of the first and second circuit boards to allow for visually observing a portion of the connector from the perpendicular direction.

12. A board assembly according to claim 11, wherein the board assembly is fixed on a main board having mounted thereon an electronic component to be installed in an electronic apparatus, the board assembly being fixed on the main board such that a predetermined space is formed between the board assembly and the main board, and the first circuit board is disposed on the main circuit board side.

13. An electronic apparatus comprising:
a planar circuit board having a first surface and a second, opposite surface;
a first connector disposed on the first surface of the circuit board at an end of the circuit board;
a second connector capable of mating with the first connector; and
a main circuit board on which an electronic component is mounted,
wherein the circuit board is fixed on the main board such that a predetermined space is formed between the circuit board and the main board, and the circuit board is disposed on the main circuit board side, with the connector between the first surface and the main board, and
wherein an opening is formed at the end to extend from the first surface to the second surface over the first connector which allows for visually observing the first connector from a position perpendicular to the second surface of the planar circuit board.

14. A board assembly comprising:
a planar circuit board having opposite first and second surfaces; and
a connector disposed on the first surface at an end of the circuit board,
wherein the board assembly is fixed on a main board having mounted thereon an electronic component to be installed in an electronic apparatus, the board assembly being fixed on the main board such that a predetermined space is formed between the board assembly and the main board, and the circuit board is disposed on the main circuit board with the connector therebetween, and
wherein the circuit board has an opening formed at the end to extend between the first and second surfaces over the connector which allows for visually observing the connector from a position perpendicular to the planar second surface.

* * * * *